United States Patent [19]

Evans et al.

[11] Patent Number: 5,159,512
[45] Date of Patent: Oct. 27, 1992

[54] CONSTRUCTION OF MINKOWSKI SUMS AND DERIVATIVES MORPHOLOGICAL COMBINATIONS OF ARBITRARY POLYHEDRA IN CAD/CAM SYSTEMS

[75] Inventors: Roger C. Evans, Yorktown Heights; Michael A. O'Connor, Mahopac; Jaroslaw R. Rossignac, Ossining, all of N.Y.

[73] Assignee: International Business Machines Corporation, Armonk, N.Y.

[21] Appl. No.: 727,391

[22] Filed: Jul. 5, 1991

Related U.S. Application Data

[63] Continuation of Ser. No. 366,988, Jun. 16, 1989, abandoned.

[51] Int. Cl.$^5$ .............................................. G06F 5/62
[52] U.S. Cl. ................................ 395/119; 395/133; 395/141
[58] Field of Search ................ 364/522; 395/119, 120, 395/133, 141

[56] References Cited

U.S. PATENT DOCUMENTS 3,987,412 10/1976 Morrin .
3,990,044 11/1976 Fahey et al. .
4,736,306 4/1988 Christensen et al. .
4,785,399 11/1988 Evans et al. .

OTHER PUBLICATIONS

A Mathematical Model for Shape Description Using Minkowski Operators, Computer Vision Graphics and Image Processing, vol. 44, No. 3, Dec. 1988, New York, US, pp. 239–243, 247–269.
J. Serra, "Introduction to Mathematical Morphology," (1986) Computer Vision, Graphics, and Image Processing, 35, pp. 283–305.
J. Serra, (1982) Image Analysis and Mathematical Morphology, Academia Press, pp. 47–48.
T. Lozano-Perez et al., "An Algorithm for Planning Collision-Free Paths Among Polyhedral Obstacles," (1979), Comm. ACM, 22, pp. 560–570.
J. Rossignac et al., "Offsetting Operations in Solid Modelling," (1986), Computer Aided Geom. Design, 3, pp. 129–148.
J. R. Rossignac, "Blending and Offsetting Solid Models," (1985), TM 54 Production Automation Project, Univ. of Rochester.
R. T. Farouki, "The Approximation of Non-Degenerate Offset Surfaces," (1985), Computer Aided Geom. Design, 3, pp. 15–43.
R. C. Evans et al., "Shaping Geom. Objects by Cumulative Translational Sweeps," (1987) IBM J. Res. Develop., 31, pp. 343–360.
G. M. Koppelman et al. "OYSTER: A Study of Integrated Circuits in Three-Dimensional Structures," (1983) IBM J. Res & Dev, 27, pp. 149–163.
M. A. Wesley et al., "A Geometric Modeling System for Automated Mechanical Assembly," (1980) IBM J Res & Dev, 24, No. 1, pp. 64–74.
R. N. Wolfe et al., "Solid Modeling for Production Design" (1987) IBM J. Res. & Dev., 31, No. 3, pp. 277–294.
R. T. Farouki, "Exact Offset Procedures for Simple Solids" (1985) Computer Aided Geometric Design 2, pp. 257–279.

*Primary Examiner*—Gary V. Harkcom
*Assistant Examiner*—Mark K. Zimmerman
*Attorney, Agent, or Firm*—Whitham & Marhoefer

[57] ABSTRACT

A method for constructing the Minkowski sum and derivative morphological combinations of arbitrary polyhedra uses operations supported in current CAD/CAM systems. The method has application to three-dimensional modeling of very large scale integrated (VLSI) circuits, their design and simulation of fabrication, and to automated mechanical assembly. The method also has application to n-dimensional modeling in robotics as well as other applications of CAD/CAM systems. In one aspect, an exact Minkowski sum of two polyhedra is obtained by a generalization of sweeping a face along an edge. More generally, according to a second aspect, the Minkowski sum of two polyhedra is computed as the union of linear translational sweeps enabled by the first aspect. The method implements techniques and formulas which greatly reduces the overall cost of the computation of Minkowski sums and, in particular, avoids computations involving non-transversal polyhedra. In a third aspect, the method reduces the difficulty of computing the Minkowski sum of a convex polyhedron and a general polyhedron by using simpler surrogate sets for the convex polyhedron.

42 Claims, 14 Drawing Sheets

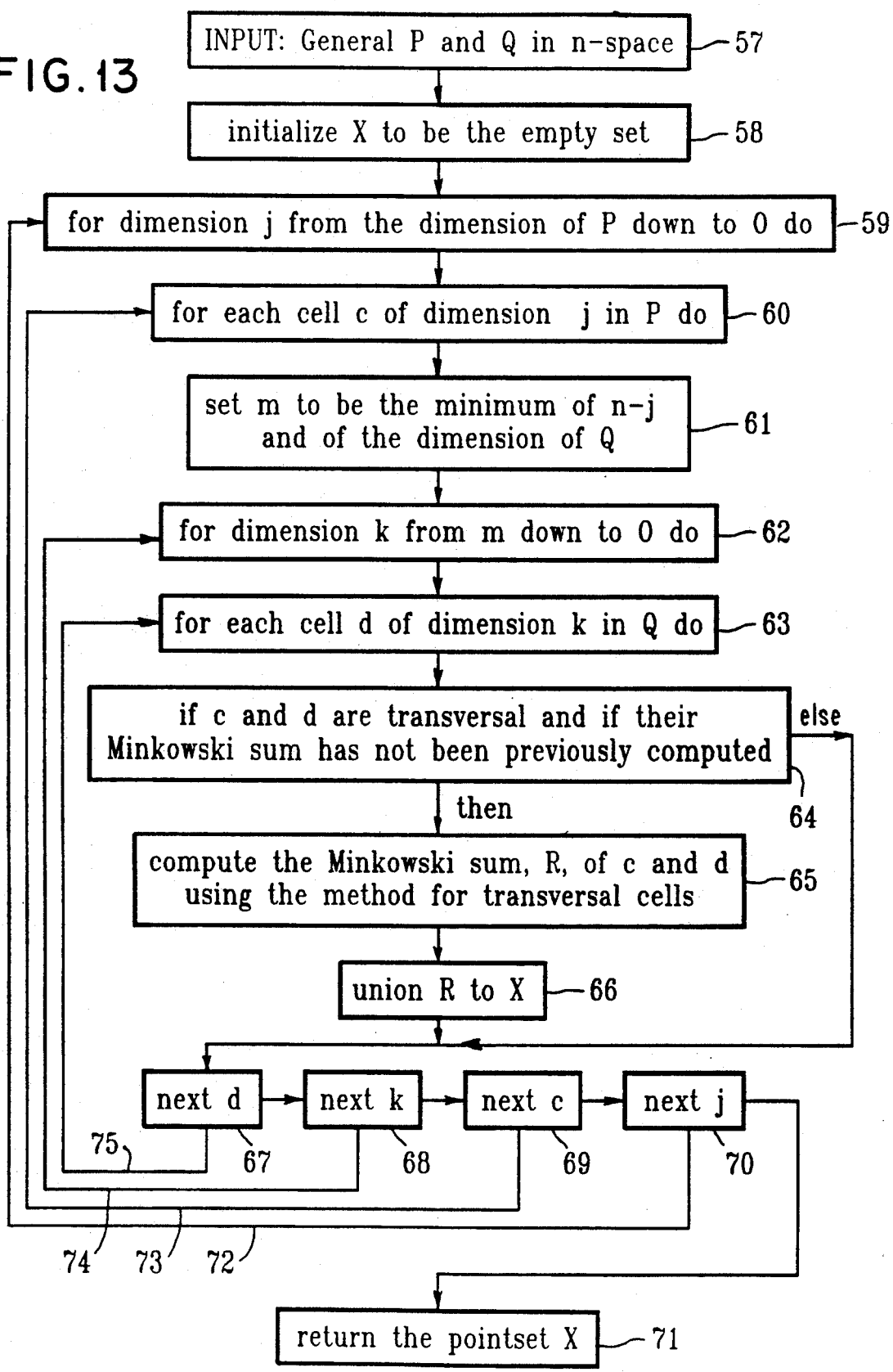

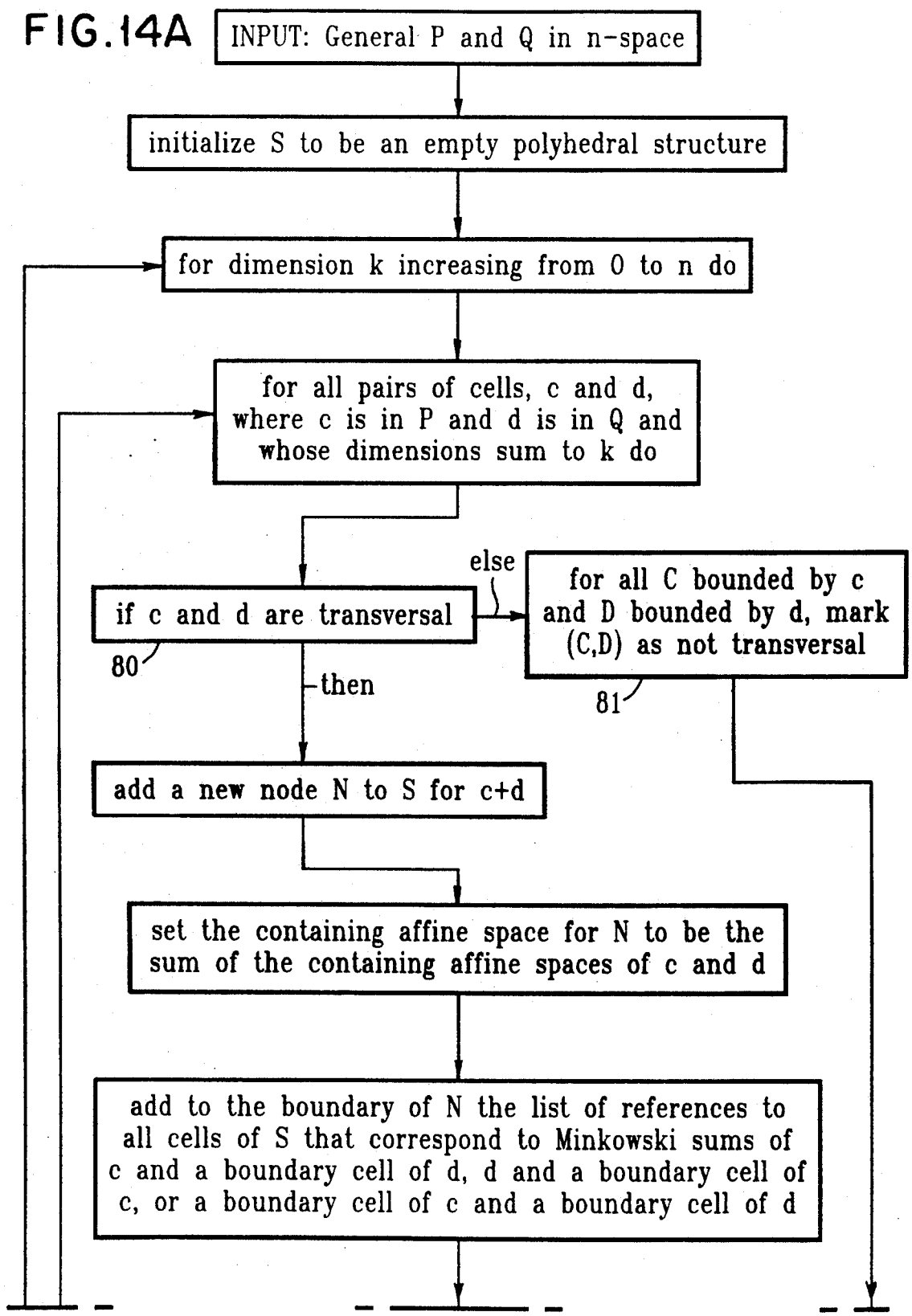

CONSTRUCTION OF MINKOWSKI SUMS AND DERIVATIVES MORPHOLOGICAL COMBINATIONS OF ARBITRARY POLYHEDRA IN CAD/CAM SYSTEMS

This application is a continuation of application Ser. No. 07/366,988, filed Jun. 16, 1989, now abandoned.

BACKGROUND OF THE INVENTION

1. Field of the Invention

The present invention generally relates to Computer Aided Design (CAD) and Computer Aided Manufacturing (CAM) systems and, more particularly, to a new method for constructing the Minkowski sums and any derivative morphological transformations of arbitrary (2, 3 or more generally n-dimensional) polyhedra by using standard tools (such as unions, intersections, translations, and linear translational sweeps (LTS)) of existent and proposed geometrical modeling systems based on boundary representation. The invention has broad application to three-dimensional modeling of very large scale integrated (VLSI) circuits, their design and fabrication, mechanical assembly, path planning and collision detection for robots, as well as many other applications of CAD/CAM systems and their underlying geometrical modelling systems.

2. Description of the Prior Art

Operations for constructing solids in currently available commercial CAD systems are limited to instantiations of simple parameterized primitive solids, translational and rotational sweeps, extrusions of two-dimensional cross-sections, rigid motions, and Boolean combinations. Such facilities are insufficient to accommodate many potential CAD/CAM applications. In addition to the automatic generation of engineering drawings and realistic pictures and the analysis of volumetric properties of solid models, the use of CAD systems for planning and simulating manufacturing operations is an essential part of design automation. Experimental systems providing restricted types of bending, twisting, growing, shrinking, rounding, and filleting operations have been publicized. Since these operations typically produce solids bounded by subsets of complicated surfaces, their effects are approximated in terms of the simple surfaces (often restricted to planes) supported by the CAD systems.

Minkowski sums of polyhedra have important applications in CAD/CAM systems. The Minkowski sum of two subsets of n-space, A and B, is defined as $$A \oplus B = \{a+b : a \in A, b \in B\}.$$

The Minkowski sum (and derivative operations) or equivalent formulations have been considered in various contexts, such as in mathematical morphology, in robotic path planning, in offsetting operations, and in certain manufacturing applications, including the simulation of process steps in integrated circuit fabrication. The Minkowski difference of A and B, is defined as $$A \ominus B = (A^c \ominus B)^c,$$

where $A^c$ denotes the complement of the set A, and the reflection with respect to the origin of A is defined as $$A' = \{-a : a \in A\}.$$

In mathematical morphology, the Minkowski sum, the Minkowski difference and the reflection are taken as primitive operations. In terms of these primitives, other powerful morphological transformations with wide applicability to modelling are defined. For example, the erosion of A by B is defined as $$A \ominus B',$$

and the opening of A with respect to B is defined as $$(A \ominus B') \oplus B,$$

which corresponds to removing the narrow slivers and smoothing small protuberances of A and rounding the convex edges of A in a manner controlled by the shape of B.

FIG. 1 is an example of two polyhedra, 1 and 2 in three-space for which the polyhedron 1 is to be opened by the polyhedron 2. FIG. 2 is the result of the opening of polyhedron 1 with respect to polyhedron 2 for the two polyhedra in FIG. 1.

The published work in this area is rich, very general, and varied; however, the emphasis in the field has been on analytical and algebraic results or in general discussions of applications, especially in the areas of computer vision and porosity analysis. Although, in addition to the simple calculations of reflections and complements, only the calculation of the Minkowski sum is necessary to enable the use of these results in CAD systems, little, if any, information is available in this area on explicitly how to calculate the Minkowski sum.

In robotics, one of the classical problems is to determine a path for an object from an initial state to a final state while avoiding a set of known obstacles. In its simplest formulation, the path is required to be purely translational; that is, no rotations or other shape transformations are allowed. Generally, this has been attacked by dilating the obstacles in a manner dependent on the shape of the object, defining the free space as the complement of the dilated obstacles, and finding a piece-wise linear path in the free space. The dilation of obstacle A by object B is defined in terms of Minkowski sums as $$A \oplus B'.$$

More complex and realistic variants of the problem to moving obstacles and rotating objects with moveable subparts have also been treated by Minkowski sums, generally described in higher (i.e., greater than three) dimensional configuration and configuration/time spaces. However, only for the simplest variant has attention been paid to the actual calculation of the required Minkowski sum. In this situation, an ad hoc method has been described for a two-dimensional polyhedral situation with convex objects and convex obstacles with some indications that the approach could be extended to the three-dimensional convex polyhedral case.

FIG. 3 is a polyhedral approximation of a piano 4 in a polyhedral hall 5. FIG. 4 illustrates the type of calculation not taught in the prior art but for which a solution enabled by means of Minkowski sums is desired. More specifically, FIG. 4 represents the translational free space 6 for the motion of a polyhedral approximation of a piano in the hall. FIG. 5 illustrates an example of a polyhedral approximation of a gripper of a robot 7 in a workcell 8. FIG. 6 illustrates the type of calculation not taught in the prior art but for which a solution enabled by means of Minkowski sums is desired. More specifically, FIG. 6 represents the translational free space 9 for the motion of the polyhedral approximation of the gripper of a robot in the workcell.

The offsetting of one solid object or surface A by another B can be described in terms of the Minkowski sum as the calculation of

A⊕B.

The technique has been applied in rounding and filleting operations, the calculation of cutter paths, and in dimensioning and tolerancing studies. These studies have been limited to the situation in which either A or B is a ball or a sphere in three-space. Some exact solutions have been obtained for simple surfaces, and for more complex surfaces and objects, polyhedral and other approximations have been attempted with mixed results.

Certain manufacturing operations, such as some deposition and etching processes in the fabrication of silicon devices such as integrated circuits, result in uniform addition or subtraction of material at specific regions along a solid's boundary. A large class of such transformations have been adequately modelled by Minkowski sums and differences, which combine the solid to be transformed with another geometric set. For example, to grow a solid A by a given amount k along a specified direction v it suffices to generate the Minkowski sum A⊕{sv: 0≦s≦k}, which corresponds to the region swept by A as it linearly moves by the distance k along v. More realistic models of the effect of these or other deposition or etching operations require the Minkowski sum of A with more complicated objects. Often the sharp edges formed by the simple directional deposition or etching model are smoothed by Minkowski sums and derivative calculations involving objects generated by Cumulative Translational Sweeps (CTS). A CTS offsetter is defined by the Minkowski sum of finitely many line segments, so that they are always convex, symmetric polyhedra. Smoothing operations and other applications would be better served by wider choice of polyhedra.

FIG. 7 illustrates an example of a CTS approximation of a sphere, and FIG. 8 is an alternative non-CTS approximation. FIG. 9 is a schematic representation of the result of using the object 11 of FIG. 7 as an offset in an operation for a simulation of a deposition process step in the fabrication of a silicon device. FIG. 10 is a schematic representation of a smoother result of using the object 12 of FIG. 8 as an offset in the same operation which is not available in the prior art. This simulation of a deposition process step in the fabrication of a silicon device is more accurate than that of FIG. 9.

Experimental systems providing restricted types of bending, twisting, growing, shrinking, rounding, and filleting operations have been publicized. Some systems have been proposed to extend the coverage to four or more dimensions with support for many of these operations. Since these operations can produce solids bounded by subsets of complicated surfaces, their effects are often approximated in terms of polyhedra which are supported by all CAD systems. Yet even for the class of polyhedra, except for the trivial cases of translations and linear sweeps along edges, no general support of Minkowski sums has been reported or claimed in commercial, experimental or proposed modeling systems.

The following patent and publications are representative of the prior art:

Jean Serra, in "Introduction to Mathematical Morphology", *Computer Vision, Graphics, and Image Processing*, 35, pp. 283–305 (1986), shows the use of Minkowski sums in morphological transformations and mathematically develops algebraic and analytic properties of them.

Jean Serra, in *Image Analysis and Mathematical Morphology*, Academic Press (1982), at pp. 47–48, shows the algebraic properties of dilation and erosion operations on discrete domains such as the pixels of an image.

T. Lozano-Perez and M. Wesley, in "An Algorithm for Planning Collision-free Paths Among Polyhedral Obstacles", *Comm. ACM*, 22, pp. 560–570 (1979), show how to solve the simplest variant of the path planning algorithm by means of Minkowski sums and describe how to find the Minkowski sum of two convex polyhedra in two-space and suggest extensions to a method in three-space.

J. R. Rossignac and A. A. G. Requicha, in "Offsetting Operations in Solid Modelling", *Computer Aided Geom. Design*, 3, pp. 129–148 (1986), show a method for the computation of the Minkowski sums of balls and simple full dimensional objects in three-space.

J. R. Rossignac, in "Blending and Offsetting Solid Models", *TM 54 Production Automation Project* (also Ph.D. Dissertation), University of Rochester, June 1985, shows applications of the previous method to the blending of solids in three-space.

R. T. Farouki, in "The Approximation of Non-degenerate Offset Surfaces", *Computer Aided Geom. Design*, 3, pp. 15–43 (1985), shows a method for calculating offsets of a B-spline surface, which in certain cases is equivalent to computing the boundary of the Minkowski sum of the surface with a ball.

R. C. Evans, G. Koppelman and V. T. Rajan, in U.S. Pat. No. 4,785,399 for "Growing, Shrinking, and Rounding Polyhedra by Controlled Sweeps", show a method for the computation of the Minkowski sum of a CTS body and a general polyhedron and show how a CTS can be used to modify the shape of a polyhedron for use in modelling.

R. C. Evans, G. Koppelman and V. T. Rajan, in "Shaping Geometric Objects by Cumulative Translational Sweeps", *IBM J. Res. Develop.*, 31, pp. 343–360 (1987), show a method for the computation of the Minkowski sum of a CTS body and a general polyhedron and show how a CTS can be used to modify the shape of a polyhedron for use in modelling process steps in the fabrication of silicon devices.

G. M. Koppelman and M. A. Wesley, in "OYSTER: A Study of integrated Circuits as Three-Dimensional Structures", *IBM J. Res. Develop.*, 27, No. 2, pp. 149–163 (1983), show the application of solid modelling techniques to the simulation of process steps in the fabrication of silicon devices.

The prior art shows the use of Minkowski sums for morphological transformations, the use of Minkowski sums in path planning in two, three and n-space, and the use of Minkowski sums in the calculation of offset bodies and shaping operations for simulation of manufacturing processes. The prior art also shows methods for the computation of the Minkowski sums of pairs of convex polyhedral bodies in two-space and suggests methods for pairs of convex polyhedra in three-space, methods for the computation of the Minkowski sum of a ball or sphere with a restricted class of solid bodies or surfaces in three-space, and a method for the computation in three-space of the Minkowski sum of a polyhedron and a body which is a member of a restricted class of bounded, convex, symmetric polyhedra, namely the CTS bodies.

The prior art, however, fails to show or suggest methods or techniques for the computation of the Minkowski sum of two general polyhedra in n-space, methods or techniques for the computation of the Minkowski sum of a full dimensional polyhedron and a general polyhedron, or methods or techniques for the computation of the Minkowski sum of a general convex polyhedron and a general polyhedron. Even in three-space, the prior art fails to show or suggest methods or techniques with these capabilities.

Moreover, the prior art neither shows nor does it suggest the reduction of the problem of the computation of the Minkowski sum of two general polyhedra in n-space to the computation of the Minkowski sums of transversal cells, the computation of the Minkowski sum of a pair of transversal cells by a generalization of linear translational sweeps, or the advantages of treating only pairs of strongly transversal cells. Nor does the prior art teach the method of reducing the complexity of the computation of the Minkowski sum of a full dimensional polyhedron and a general polyhedron to the computation of the Minkowski sum of pairs of transversal (or strongly transversal) cells, the sum of whose dimensions is full, or the method of reducing the complexity of the computation of the Minkowski sum of a general convex polyhedron and a general polyhedron by the use of surrogates. Finally, the prior art neither shows nor suggests that each and every one of these capabilities can be supported by the standard tools and their generalizations in n-space or that in three-space tools sufficient to support these capabilities exist in the underlying geometrical modelling systems of most existent and proposed CAD/CAM systems.

SUMMARY OF THE INVENTION

It is therefore an object of this invention to provide procedures and techniques for generalizing and using standard tools (e.g., unions, intersections, translations, and linear translational sweeps) of CAD/CAM systems to form the Minkowski sums of two general polyhedra of n-space.

If one of the polyhedra is convex or full dimensional, it is another object of the invention to provide special procedures and techniques that significantly reduce the cost of computation of the Minkowski sum of the two polyhedra.

For the most common situation in which the polyhedra are three-dimensional, it is a further object of the invention to provide techniques employing only facilities available in current implementations of three-dimensional geometrical modelling systems that implement the previous two objects of the invention.

In all cases, it is yet another object of the invention to apply techniques which eliminate redundant operations.

A polyhedron in n-space is a collection of open affine cells. Thus, a three-dimensional polyhedron is represented by its vertices, open edges, open faces, and open volumes. In three-dimensions, the standard means to compute the Minkowski sum of a face and a transversal edge is to perform a linear translational sweep of the face by the edge to obtain a volume.

Two affine cells are transversal if no line segment contained in one of them is parallel to the smallest affine space containing the other. It is an aspect of the invention to compute the Minkowski sum of the closures of two transversal affine cells by a method generalizing linear translational sweeps to transversal cells of any dimension. Furthermore, it is an aspect of the invention to perform the calculation of the Minkowski sum of two general polyhedra by taking the union of the Minkowski sums of pairs of transversal cells.

An affine cell, c, of a polyhedron, P, is strongly transversal to an affine cell, d, of a polyhedron, Q, if every affine cell that contains c and is contained in P and every affine cell that contains d and is contained in Q are transversal. It is a further aspect of the invention to perform the calculation of the Minkowski sum of two general polyhedra by taking only the union of the Minkowski sums of pairs of strongly transversal cells.

If the closure of the n-dimensional interior of a polyhedron in n-space equals the polyhedron itself, then the polyhedron is said to be full dimensional. If one of two polyhedra is full dimensional, it is an aspect of the invention to obtain the Minkowski sum of the two by taking only the union of the Minkowski sums of pairs of closures of transversal (or strongly transversal) cells whose dimensions sum to n. In particular, if A and B are polyhedra in three-space, one of which is full dimensional, this implies that the Minkowski sum of A and B is obtained as the union of translates A by the vertices of B, the linear translational sweeps of faces of A by transversal (or strongly transversal) edges of B, the translates of B by the vertices of A, and the linear translational sweeps of faces of B by transversal (or strongly transversal) edges of A. Alternatively, the Minkowski sum of A and B can be obtained by taking the union of the linear translational sweeps of A by the edges of B and the linear translational sweeps of B by the edges of A.

When one of two polyhedra is convex, it is an aspect of the invention to reduce the complexity of the Minkowski sum of the polyhedra by the use of simpler surrogate sets, to use an annihilator of the tangent space of an affine cell to determine a simpler surrogate set for the convex set, and in particular to obtain the Minkowski sum of the polyhedra as the union of the Minkowski sums of each affine cell of the general polyhedra and a surrogate set for the convex set with respect to the affine cell. In particular, when the polyhedra are three-dimensional, it is an aspect of the invention to obtain a single point as a surrogate set for a convex set with respect to a volume, to obtain an edge as a surrogate set for a convex set with respect to a face, and to obtain a collection of faces as a surrogate set for a convex set with respect to an edge.

BRIEF DESCRIPTION OF THE DRAWINGS

The foregoing and other objects, aspects and advantages of the invention will be better understood from the following detailed description of a preferred embodiment of the invention with reference to the drawings, in which:

FIG. 13 is a flow diagram showing the process of forming the Minkowski sum of two general polyhedra in n-space;

FIGS. 14A and 14B are flow diagrams showing the process incorporating the combined methods of FIGS. 11 and 13;

DETAILED DESCRIPTION OF PREFERRED EMBODIMENTS OF THE INVENTION

Figure 1:
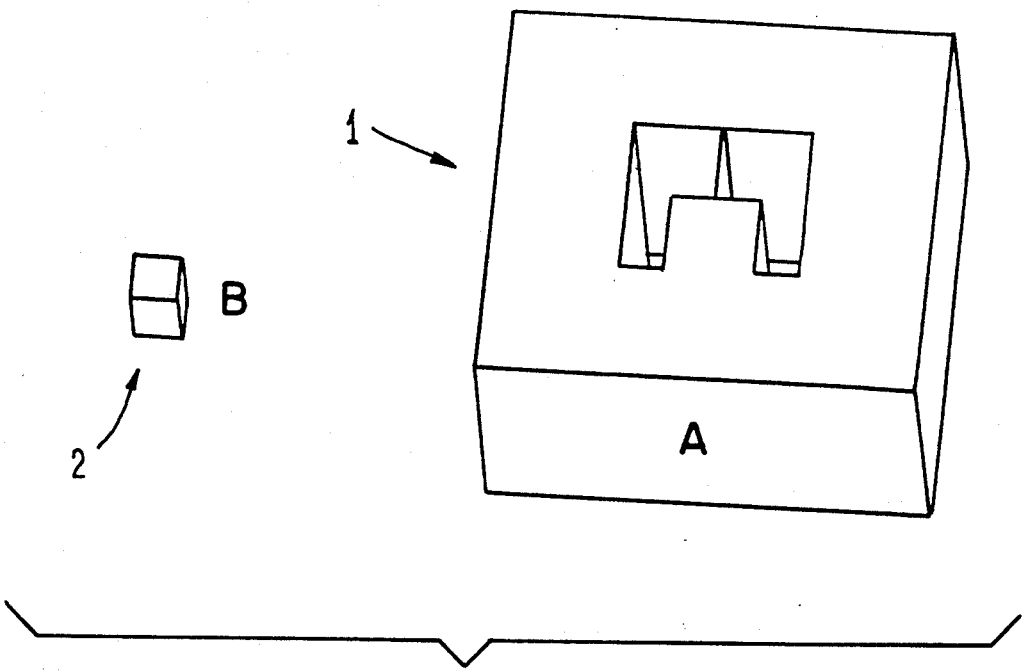
FIG. 1 is an orthographic drawing showing an example of two polyhedra.
Figure 2:
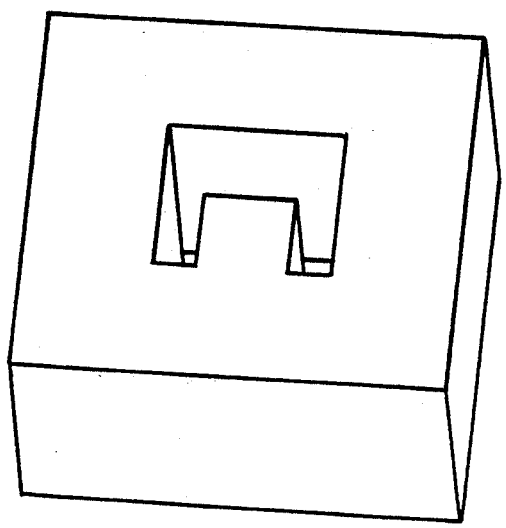
FIG. 2 is an orthographic drawing showing the result of opening one of the polyhedra with respect to the other in FIG. 1.
Figure 3:
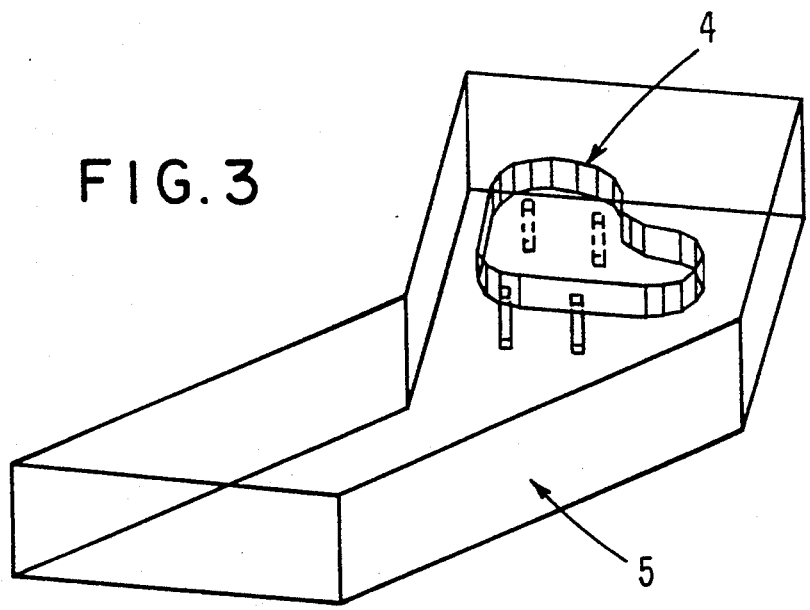
FIG. 3 is a polyhedral approximation of a piano in a polyhedral hall.
Figure 4:
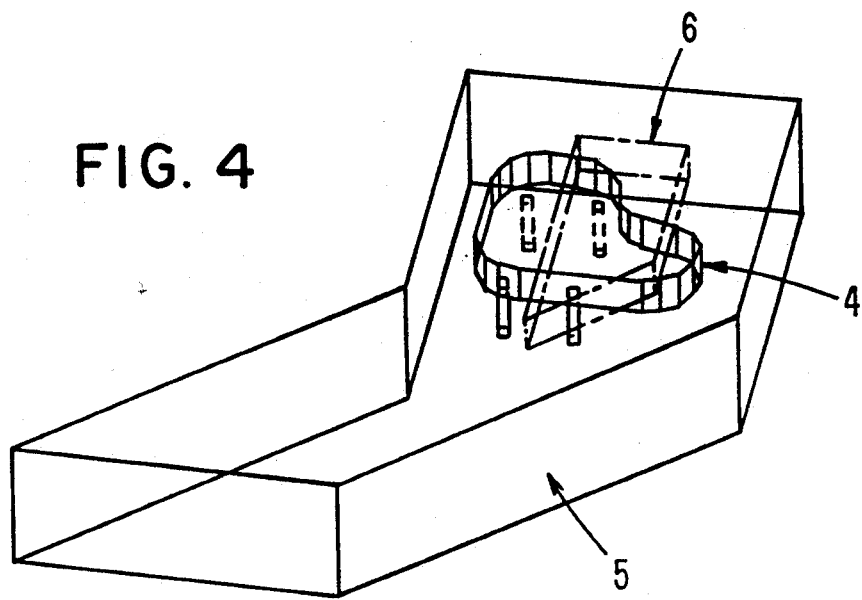
FIG. 4 is an example of the calculation enabled by means of the invention.
Figure 5:
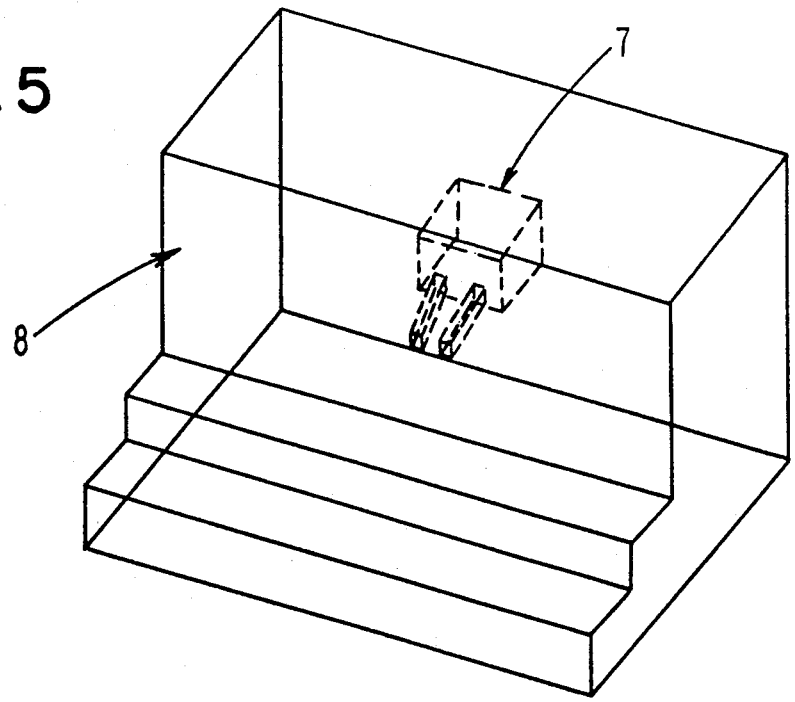
FIG. 5 is a polyhedral approximation of a gripper of a robot in a workcell.
Figure 6:
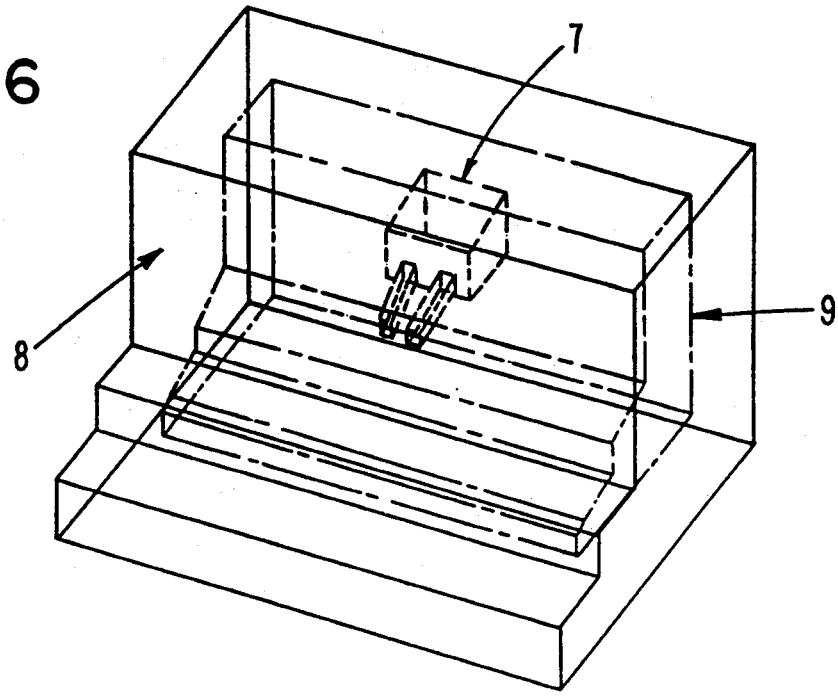
FIG. 6 is an example of the calculation enabled by means of the invention.
Figure 7:
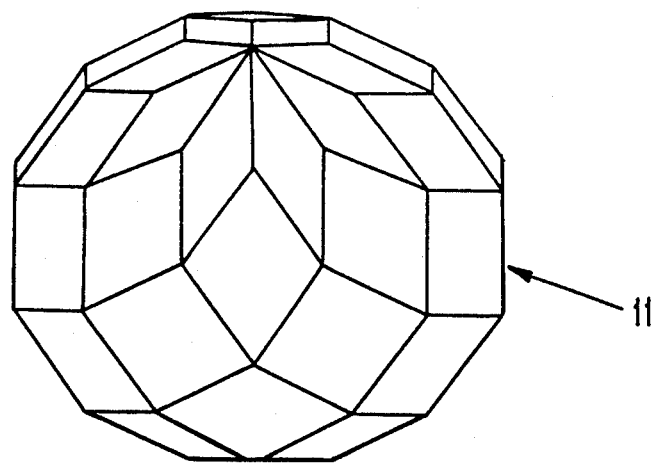
FIG. 7 is an example of a CTS approximation of a sphere.
Figure 8:
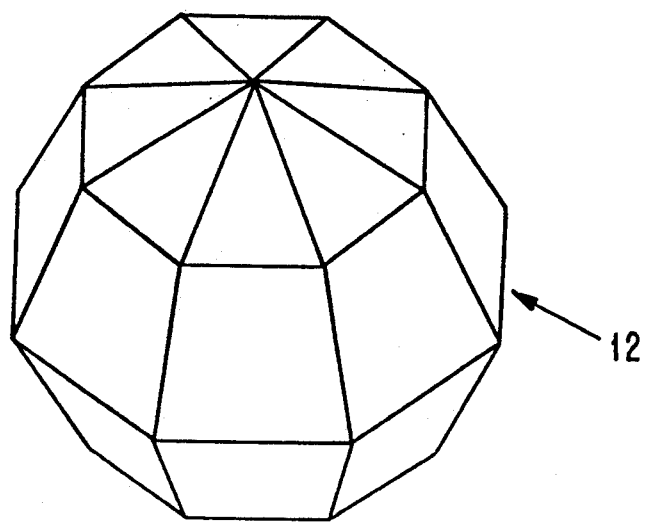
FIG. 8 is an example of an alternative, non-CTS approximation of a sphere.
Figure 9:
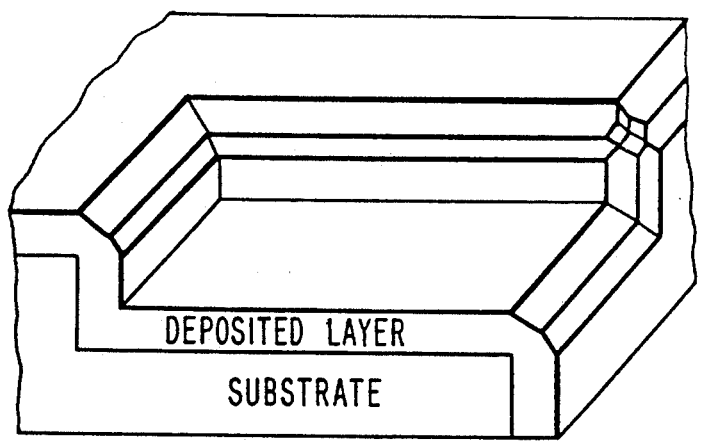
FIG. 9 is an orthographic view, partially in cross-section, showing a representation of the result of using the object in FIG. 7 as an offsetter in a simulation operation.
Figure 10:
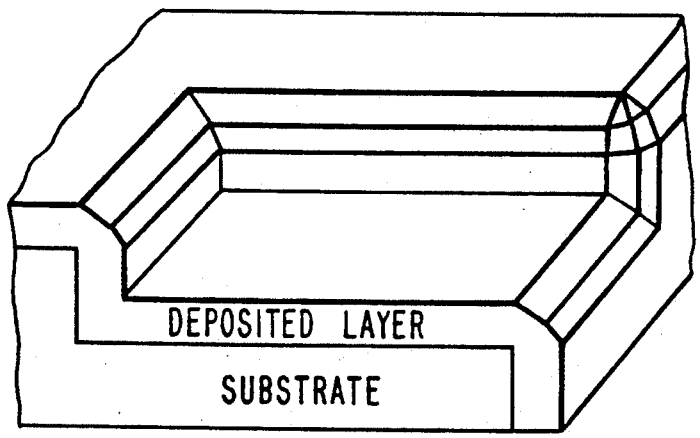
FIG. 10 is an orthographic view, partially in cross-section, showing a representation of the smoother result of using the object in FIG. 8 as an offsetter in the simulation operation.

The detailed description of the invention is prefaced by introducing some basic terminology and properties of polyhedra. In particular, the key concepts of an affine cell, a polyhedron, a cell decomposition, and the transversality of affine cells are discussed. Following this, a method which enables the computation of the Minkowski sum of transversal cells by generalizing the standard technique for sweeping a face by a transversal edge is presented, and a pseudocode fragment implementing this method is presented. Next, it is shown by the use of surrogate points and a decomposition of a polyhedron as a union of polyhedra containing no affine lines that the computation of the Minkowski sum of two general polyhedra can be obtained by considering only the sums of transversal pairs of affine cells. This leads to a general method for the computation of the Minkowski sum of two general polyhedra, and a fragment of pseudocode that can implement this method is also presented. An improvement of this general method by use of the concept of strong transversality is then considered. Thereafter, full dimensionality is defined and used to develop a special technique advantageous in this situation, and a possible implementation of this technique is presented as a pseudocode fragment. Special attention is paid to the most common case where the polyhedra are three-dimensional. Finally, the case in which one of the polyhedra is convex is fully considered, both in general and in several important special cases. These pieces are used to construct an algorithm which efficiently calculates the Minkowski sum of a convex polyhedron and a general polyhedron, and this algorithm is represented as a pseudocode fragment. In the case where the polyhedra are three-dimensional, an explicitly detailed method is described.

DEFINITIONS

Points, line segments, and lines are the most fundamental concepts of geometry. Polygons in a plane are among the first geometric objects that are encountered in a systematic way. They are usually defined as regions of a plane bounded by finite sets of line segments. A polyhedron is a somewhat more complex idea, but it also is commonly understood. All of these important objects are examples from a class of more general objects, polyhedra in $R^n$. Considering them as special cases of the more general concept often permits a simpler uniform treatment.

Even as a polygon is defined in terms of the simpler line segments, a polyhedron in $R^n$ is defined in terms of a more primitive object, the affine cell. An affine subspace of $R^n$ is a translation of a linear subspace of $R^n$. An affine cell in $R^n$ is a relatively open (in the affine space topology) connected subset of an affine subspace of $R^n$. If an affine cell is of dimension k, then it is called an affine k-cell, or a k-cell for short. The k-dimensional affine space that contains an affine k-cell, c, as a relatively open subset is denoted by V(c), and the k-dimensional space of vectors tangent to c, by T(c). T(c) is the space parallel to V(c) which contains the origin, 0, so that if V(c) contains the origin, then the two spaces coincide. For example, an open line segment in $R^1$ is an affine 1-cell in $R^1$, and an open line segment in $R^3$ is an affine 1-cell in $R^3$. A point is a 0-cell. The interior of a cube in $R^3$ is a 3-cell in $R^3$. If K is a collection of affine cells, then let cells(K,k) be the set of k-cells in K. The closure of a point set, S, is denoted $\overline{S}$, and its boundary is denoted $\delta S$. If C is a collection of point sets, then $\overline{C}$ will be the collection of the closures of the point sets in C, and [C] the union of the point sets in C. If D is also a collection of point sets, then $C \oplus D$ will denote the collection of Minkowski sums of elements of C and D; that is, $$\{c \oplus d: c \epsilon C, d \epsilon D\}.$$

A polyhedron, P, in $R^n$ is a subset of $R^n$ that can be represented as the union of a finite disjoint collection, K, of affine cells of $R^n$ such that for any $c \epsilon K$, there is a subset, J, of K so that the union of the affine cells in J yields the topological boundary of c; that is, $$\delta c = [J].$$

Any such collection of affine cells is called a cell decomposition of P. If K is a cell decomposition of a polyhedron, nd if no confusion is possible, by a slight abuse of notation we will often speak of the polyhedron, K, when in actuality referring to [K]. Conversely, if P is a polyhedron, then {P} will denote a cell decomposition of P. A polyhedron does not in general have a unique cell decomposition; however, if from the context, a particular cell decomposition, K, can be unambiguously inferred, we will often refer to an affine cell in P, rather than in K. If K is a cell decomposition, and c∈K, then let bdry(c,K) be the collection of affine cells in K, whose union yields the boundary of c. The dimension of a polyhedron, P, is defined to be the largest dimension of any affine cell in a cell decomposition of P. If P is a polyhedron, the smallest affine subspace that contains it is written as V(P), and the space of vectors tangent to V(P) as T(P). As before, T(P) is the space parallel to V(P) which contains the origin, so that if V(P) contains 0, then the two spaces coincide. In general, the dimension of P will be less than the dimension of T(P), and hence also of V(P).

All solid objects currently supported by polyhedral modelling systems are polyhedra in $R^3$ under this definition. For example, a cube in $R^3$ is a three-dimensional polyhedron defined by the collection of its open interior, six open faces, twelve open line segments, and eight vertices. Other objects, like wire frames, projections, and slices, derived from solids by polyhedral solid modelers are also polyhedra. In fact, if P is any polyhedron, and K any subset of {P} such that [K] is closed, then [K] is a polyhedron and K is a cell decomposition of it. In particular, for any c∈{P}, bdry(c,{P}) and cUbdry(c,{P}) are polyhedra. It can also be easily seen that the closure of the complement of any polyhedron is also a polyhedron.

The Minkowski Sum of Transversal Cells

Two linear subspaces are said to be transversal if their intersection is the origin. Two affine cells c and d, are said to be transversal if their tangent spaces, T(c) and T(d), are transversal. For example, a point, p, is trivially transversal to any cell, since T(p)={0}. Less trivially, an open line segment that intersects an open face in a single interior point is transversal to the face. On the other hand, two faces in $R^3$ can never by transversal, since two linear subspaces of dimension two in $R^3$ must always contain a common line. More generally, if c is a j-cell and d a k-cell in $R^n$ with $j+k>n$, then c and d cannot be transversal. Transversality is of interest, because the Minkowski sum of two transversal cells is computable within the framework of any modeler based on boundary representation, and because the Minkowski sum of two general polyhedra can always be reduced to the union of Minkowski sums of transversal cells. We justify each of these claims in turn.

There is a wide diversity of data structures and associated algorithms that can be used to implement a polyhedral modelling system based on boundary representation. However, for a cell c of a polyhedron represented in any such modelling system, the structures and algorithms suffice to find two related entities we have previously discussed, V(c) and δc, and one additional entity describing the neighborhood of δc with respect to c, namely, information which indicates on which side of its boundary δc lies. More precisely, if b is a cell in δc of dimension one less than the dimension of c that locally separates c from its complement in V(c), then any modelling system based on boundary representation can find a vector v in T(c) such that at each point in bv is directed away from c. Such a vector is called an exterior vector of b with respect to c. Conversely, for any implementation of such a modelling system, these three pieces of information suffice to define a cell. By generalizing the techniques of linear translational sweeps, these three pieces can be readily determined for the Minkowski sum of transversal cells, as we now show.

If c and d are transversal, then any affine cell in V(c) and any affine cell in V(d) are transversal, and in particular, each cell of $\bar{c}$ is transversal to each cell of $\bar{d}$. If c is a j-cell that is transversal to a k-cell, d, and p and q are points in V(c) and V(d), respectively, then c⊕d is a (j+k)-cell in the (j+k)-dimensional affine space, $$V(c \oplus d) = p \oplus q \oplus T(c) \oplus T(d).$$

Whether T(c) and T(d) are represented implicitly or in terms of sets of basis vectors, their sum is easily obtained, as is translation by p⊕q. Thus, V(c⊕d) can be easily determined when c and d are transversal.

If J is a cell decomposition of $\bar{c}$ and K is a cell decomposition of $\bar{d}$, then since Minkowski sums distribute over unions, it follows that the Minkowski sum of $\bar{c}$ and $\bar{d}$ can be written as the union of the Minkowski sums of the cells of the two polyhedra; that is, $$\bar{c} \oplus \bar{d} = [J \oplus K],$$

and moreover that J⊕K serves as a cell decomposition of $\bar{c} \oplus \bar{d}$. In particular, cells of J⊕K are mutually disjoint. The dimension of $\bar{c} \oplus \bar{d}$ j+k, and its only (j+k)-cell is c⊕d. The boundary of c⊕d equals $$(d \oplus \delta c) U (c \oplus \delta d) U (\delta c) \oplus \delta d),$$

so that bdry(c⊕d,J⊕K) is composed of the concatenation of the three disjoint collections of cells: c⊕bdry(d,K), d⊕bdry(c,J), and bdry(c,J)⊕bdry(d,K). Since each of the cells of δ(c⊕d) is of dimension less than j+k, and each is defined in terms of Minkowski sums of transversal cells, it is possible to compute $\bar{c} \oplus \bar{d}$ by an application of recursion. However, recursion can be avoided if the lower dimensional cells are already available. This availability can easily be assured by the following technique. Begin by considering the sums of 0-cells of $\bar{c}$ and cells of d in order of increasing dimension. Next, consider the sums of 1-cells of $\bar{c}$ and cells of $\bar{d}$ in order of increasing dimension. Continue in this manner with the cells of c in order of increasing dimension.

Only the cells of c⊕cells(bdry(d,K),k−1) and d⊕cells(bdry(c,J),j−1) are of dimension $k+j-1$, so that cells(bdry(c⊕d,J⊕K),k+j−1) is the concatenation of these two collections. If f is (k−1)-cell of bdry(c,j) and u is an exterior vector of f with respect to c, then it follows that u is an exterior vector of f⊕d with respect to c⊕d. Similarly, if g is (j−1)-cell of bdry(d,K) and v is an exterior vector of g with respect to d, then it follows that v is an exterior vector of c⊕g with respect to c⊕d. This implies that the neighborhood of each (k+j−1)-cell in the boundary of c⊕d can be easily inferred from lower dimensional information.

To clarify the above technique, consider its application in a very simple problem in $R^2$: computing the Minkowski sum of $\bar{c}$, the line segment on the x-axis from (0,0) to (1,0), and $\bar{d}$, the line segment on the y-axis from (0,0) to (0,1), which as is easily seen yields the unit square in the first quadrant with a vertex at the origin. Begin by obtaining the 0-cells of $\bar{c}\oplus\bar{d}$ by computing the Minkowski sum of the vertices of c ((0,0) and (1,0)) with the vertices of d ((0,0) and (0,1)). If v is any 0-cell, then T(v) is the origin, and V(v) equals {v}. Moreover, a 0-cell has no boundary, and hence no exterior vector is necessary. Thus, if v is a vertex of $\bar{c}$ and w is a vertex of $\bar{d}$, then the technique finds $$V(v\oplus w)=v+w+\{0\}+\{0\}=\{v+w\},$$

and computes no boundary or exterior vector. Continuing, the four vertices of $\bar{c}\oplus\bar{d}$ are found. Next, the 1-cells of $\bar{c}\oplus\bar{d}$ determined by the Minkowski sums of the vertices of c and the open edge, d, are computed. For example, consider the sum of vertex $v_x=(1,0)$ and d, which we denote as e. $T(v_x)$ again equals the origin, and T(d) is the y-axis. The vertex $v_y=(0,1)$ belongs to the closure of d, and hence to V(d). Thus, computing $$T(e)=v_x+v_y+T(v_x)\oplus T(d)$$

yields the line parallel to the y-axis passing through the point, (1,1). Since $v_x$ has no boundary, δe reduces to $v_x\oplus\delta d$; that is, to the Minkowski sum of $v_x$ and the origin (which yields (1,0)) and the Minkowski sum of $v_x$ and $v_y$ (which yields (1,1)), both of which have been previously treated. The vector $(0,-1)$ is an exterior vector for the origin with respect to d, and thus the same vector serves as exterior vector for (1,0), the Minkowski sum of $v_x$ and the origin, with respect to e. Similarly, (0,1) is an exterior vector for (0,1) with respect to d, so (0,1) is also an exterior vector for (1,1) with respect to e. Edge e is now completely determined, and we proceed to consider the Minkowski sum of the origin and d. This of course produces d, itself, so that the two sides of $\bar{c}\oplus\bar{d}$ parallel to the y-axis have been determined. Next, in a completely analogous manner, the sum of c, the 1-cell of $\bar{c}$, and the vertices of d produce the two sides of $\bar{c}\oplus\bar{d}$ parallel to the x-axis. Finally, the Minkowski sum of the two 1-cells, c and d, which we denote as f, is treated. T(c) is the x-axis and T(d) is the y-axis, so that T(f), and hence V(f), equals $R^2$. The boundary of f is composed of (δc)⊕ d, the vertices of $\bar{f}$, and c⊕δd and d⊕δc, the edges of $\bar{f}$ which have all been previously obtained. All that remains is to identify the exterior vectors for the edges of f. Consider, for example, the edge in d⊕δc obtained from d⊕$v_x$; that is, edge e. Vector (1,0) serves as an exterior vector for $v_x$ with respect to c, so it also serves as an exterior vector for e with respect to f.

To recapitulate, for the Minkowski sum of two transversal cells, c and d, the three pieces of information (the space that contains it, its boundary, and its neighborhood information) which are necessary to define and represent it in a modelling system can all be easily obtained directly or in terms of simple calculations from the corresponding information about c and d.

Figure 11:
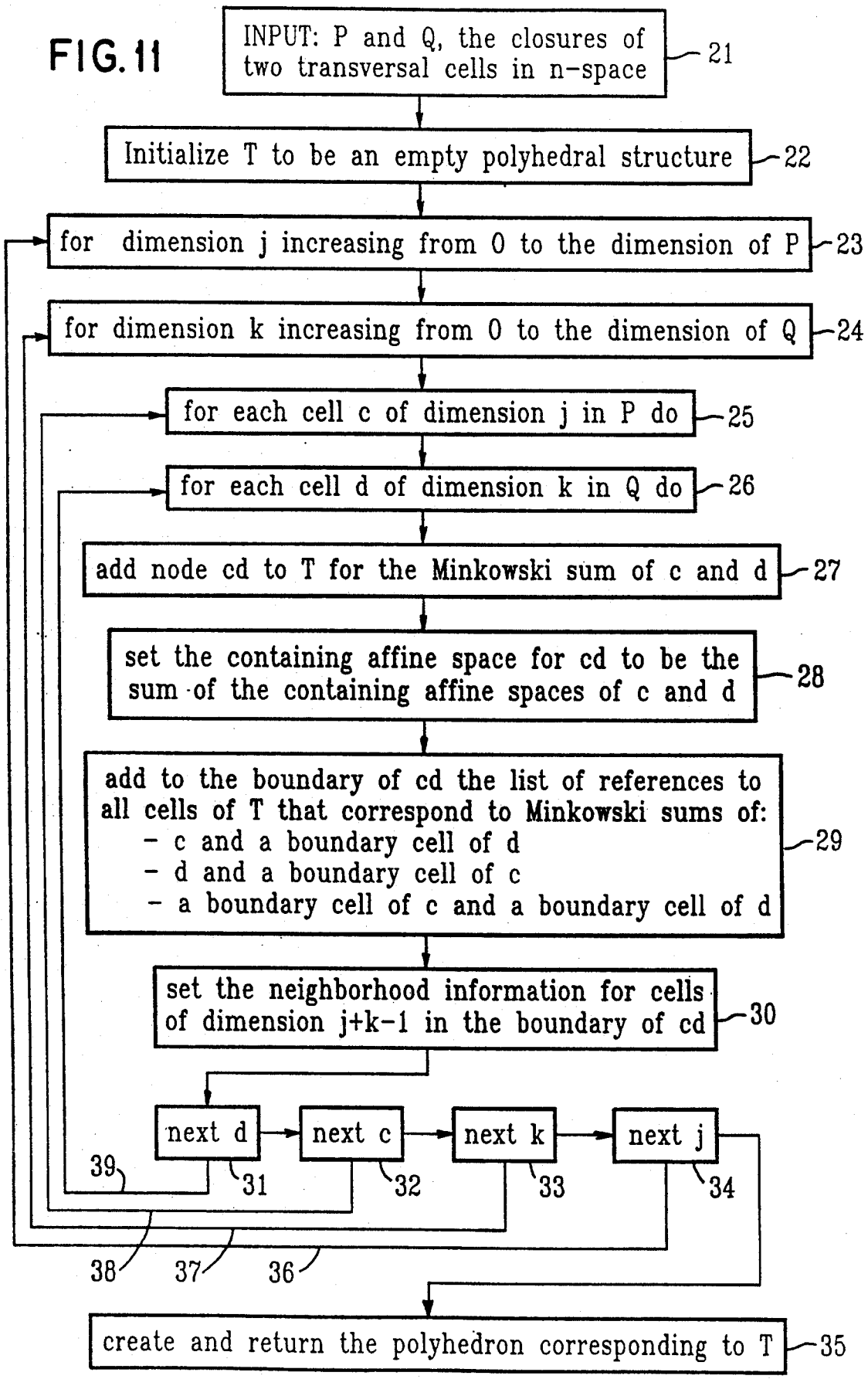
FIG. 11 is a flow diagram showing the process of forming the Minkowski sum of two transversal cells.

FIG. 11 is a flow diagram illustrating an embodiment of this portion of the invention. The process begins in block 21 where two polyhedra P and Q are input as the closures of two transversal cells in n-space. The polyhedron T is initialized in block 22 to be an empty polyhedral structure, and then a nested, multi-loop structure is entered at function block 23. The first or outer loop 36 extends from function block 23 to decision block 34 and processes the dimension j increasing from 0 to the dimension P. The next loop 37 extends from function block 24 to decision block 33 and process the dimension k increasing from 0 to the dimension Q. The following pseudocode fragment illustrates an implementation of the flow diagram. A description of the constituent parts of the pseudocode and their relationship to the blocks of FIG. 11 immediately follows the pseudocode.

```
01  Transversal_Minkowski_Sum(P,Q)
02  list_of_cells = Make_List_Of_Cells
03  for j=0 to Dim(P) repeat
04    for k=0 to Dim(Q) repeat
05      for c in Cells(P,j) repeat
06        for d in Cells(Q,k) repeat
07          {c_d = Make_New_Cell
08          Append(list_of_cells,c_d)
09          Make_Link(c,d,c_d)
10          p = Point_Of(Affine_Space_Of(c))
11          q = Point_Of(Affine_Space_Of(d))
12          c_d.space = Make_Affine_Space(p,q,
                Tangent_Space_Of(c),Tangent_
                Space_Of(d))
13          for e in c.bdry_pointers repeat
14            Append(c_d.bdry_pointers,Cell_
                Pointer(e,d))
15          for f in d.bdry_pointers repeat
16            Append(c_d.bdry_pointers,Cell_
                Pointers(c,f))
17          for e in c.bdry_pointers repeat
18            for f in d.bdry_pointers repeat
19              Append(c_d.bdry_pointers,Cell_
                  Pointers(e,f))
20          for e in c.nbhd_info repeat
21            {new_nbhd = Make_New_Neighborhood_
                Information
22            new_nbhd.bdry_cell_pointer = Cell_
                Pointer(e.bdry_cell_pointer,d)
23            new_nbhd.exterior_vector = e.exterior_
                vector
24            Append(c_d.nhbd_info,new_nbhd)}
25          for f in d.nbhd_infor repeat
26            {new_nbhd = Make_New_Neighborhood_
                Information
27            new_nbhd.bdry_cell_pointer = Cell_
                Pointer(c,f.bdry_cell_pointer)
28            new_nbhd.exterior_vector = f.exterior_
                vector
29            Append(c_d.nhbd_info,new_nbhd)}}
30  polyhedron = Make_Polyhedron_From_Cells(list_of_
      cells)
31  return(polyhedron)
```

We adopt several conventions to be used in all code fragments. Standard keywords and control structures are used. Keywords appear in lower case. Indentation is used as an aid in the identification of repeated blocks of executable commands. Blocks containing more than one executable command are bracketed by a pair of braces. All variables appear in lower case. To distinguish subroutines, each word in the subroutine is capitalized.

In general, the algorithm is implemented by the use of pointers and two special data structures, the cell structure and the neighborhood information structure. The cell structure represents a cell by means of a record with three named fields:

space, which contains a description of the minimal affine subspace containing the cell;

bdry_ptrs, which contains a list of pointers to the other cell structures which represent the cells in the boundary of the cell; and nbhd_info, which is a list of the neighborhood information structures for full dimensional boundary cells of the cell.

The neighborhood information structure represents the relationship between a cell and full dimensional cell of its boundary by means of a record with two named fields:

bdry_cell_pointer, which contains a pointer to the cell structure representing the boundary cell; and exterior_vector, which contains an exterior vector for the boundary cell with respect to the cell.

In this pseudocode fragment, the following subroutines occur:

Transversal_Minkowski_Sum which accepts as input two polyhedra that are assumed to be the closures of a pair of transversal cells or two cell structures representing such polyhedra and returns the polyhedron that is the Minkowski sum of the polyhedra;

Make_List_Of_Cells, which creates an empty list that is capable of containing cell structures;

Dim, which accepts a polyhedron as input and returns the dimension of the polyhedron;

Cells, which takes as input a polyhedron and an integer, j, and returns a list of cell structures representing the j-cells of the polyhedron;

Make_New_Cell, which creates a new cell structure;

Append, which accepts a list of any type and an instance of that type and appends the instance to the list;

Make_Link, which has as input three cell structures and creates a link between the first two and the third in the sense that after Make_Link has been invoked, the inverse routine, Cell_Pointer, when given the first two arguments (or pointers to them) returns a pointer to the third;

Affine_Space_Of, which has a cell structure as input and returns the field of that cell structure that describes the affine space containing the cell;

Point_Of, which has as input an affine space and returns a point in that space;

Tangent_Space_Of, which has as input a cell structure and returns the tangent space to the cell;

Make_Affine_Space, which takes two points and two linear spaces and returns the affine space obtained by translating the sum of the two spaces by the sum of the two points;

Make_New_Neighborhood_Information, which crates a neighborhood information structure; and finally, Make_Polyhedron_From_Cells, which takes as input a list of cell structures that defines a polyhedron and creates and returns the polyhedron.

The pseudocode fragment has the following relationships with FIG. 11. The first line of the pseudocode implements block 21 wherein two polyhedra, P and Q, that correspond to the closure of two transversal cells are input. The second line implements block 22 wherein an empty polyhedral structure is created as an empty list of cell structures. Lines 3 through 29 implement the outermost loop 36, wherein a loop is indexed by j which increases from 0 to the dimension of P where j corresponds to the dimension of a cell, c of P, to be used within blocks 27, 28, 29, and 30. Lines 4 through 29 implement the next outermost loop 37, wherein a loop is indexed by k which increases from 0 to the dimension of Q where k corresponds to the dimension of a cell, d of Q, to be used within blocks 27, 28, 29, and 30. Lines 5 through 29 implement the next outermost loop 38, wherein a cell, c of P, of dimension j, is chosen. Lines 6 through 29 implement the innermost loop 39, wherein a cell, d of Q, is chosen. Inner blocks 27, 28, 29, and 30 are implemented by lines 7 through 29 which are repeated for each choice of c in P and d in Q. In particular, by creating a new cell structure and appending it to the list of cell structures created in line 2, lines 7 and 8 implement block 27, wherein a new node is added to the polyhedral structure. Lines 10 through 12 implement block 28 wherein the sum of the spaces containing c and d is found, because it will be the space that contains $c \oplus d$. Lines 13 through 19 implement block 29, wherein the boundary of $c \oplus d$ is obtained. In particular, in lines 13 and 14, the pointers to the cell structures corresponding to boundary cells of $c \oplus d$ that are created by the Minkowski sums of d and a boundary cell of c are appended to c_d.bdry_pointers, which is the field that represents the boundary $c \oplus d$. Access to these pointers is enabled by subroutine Make_Link of line 9 which establishes a link between two cell structures and the cell structure representing their Minkowski sum and by subroutine Cell_Pointer which uses this link. Lines 15 and 16 perform the same function for boundary cells of $c \oplus d$ that correspond to the Minkowski sum of c and a boundary cell of d, and lines 17, 18 and 19 perform the same function for boundary cells of $c \oplus d$ that correspond to the Minkowski sum of the boundary cell of c and a boundary cell of d. Lines 20 through 29 implement block 30, wherein the neighborhood information for boundary cells of $c \oplus d$ that are of dimension one less than the dimension of $c \oplus d$ is obtained. In particular, lines 20 through 24 accomplish the implementation for the cells created as the Minkowski sum of d and a (j−1)-cell of the boundary of c, while, lines 25 through 29 accomplish the implementation for the cells created as the Minkowski sum of c and (k−1)-cell of the boundary of d. The relative position of the loops assure that when the cell structure corresponding to the Minkowski sum of $c \oplus d$ is being processed, all of its boundary cells have been previously processed and are available. When the four outer loops of the pseudocode (corresponding to loops 36 to 39 of FIG. 11) have been completed, information sufficient to describe each cell of $P \oplus Q$ is present. The final block of the algorithm described in FIG. 11, block 35, now creates and returns the polyhedron so defined, and this is implemented in the pseudocode by lines 30 and 31.

The Minkowski Sum of General Polyhedra

If c and d are two cells that are not transversal, then the intersection of T(c) and T(d) must contain a line, L={tv: t∈R}. For two points, p and q, obviously $p+q=(p+tv)+(q-tv)$ for any real number t. If p is in c and q is in d, and c contains no affine lines, then there must be some t so that p+tv belongs to δc and q−tv belongs to d or, conversely, p+tv belongs to c and q−tv belongs to δd. In the first case, the sum of p and q equals the sum of a point from a cell, e, in the boundary of c, which then must be of lower dimension than the dimension of c, and a point from a cell, f, in the closure of d, which then must have dimension less than or equal to the dimension of d. Similarly, in the second case, the sum of p and q equals the sum of a point from a cell, e in the closure of c, which then must have dimension less than or equal to the dimension of c, and a point from a cell, f, in the boundary of d, which then must have dimension less than the dimension of d. If e and f are not transversal, we can repeat the argument. Since the dimensions are decreasing and, as has been noted, a point is transversal to any cell, it follows that it is always possible to find a pair of transversal cells, g in c and h in d, such that the sum of p and q is contained in $g \oplus h$. Any points, r and s, which can be substituted for p and q, that is such that $r+s=p+q$, will be called surrogates for p and q. The existence of surrogates in transversal cells for pairs in nontransversal cells implies that Minkowski sums of nontransversal cells can be ignored in the Minkowski sum of a general polyhedron and a polyhedron that contains no affine lines.

Figure 12:
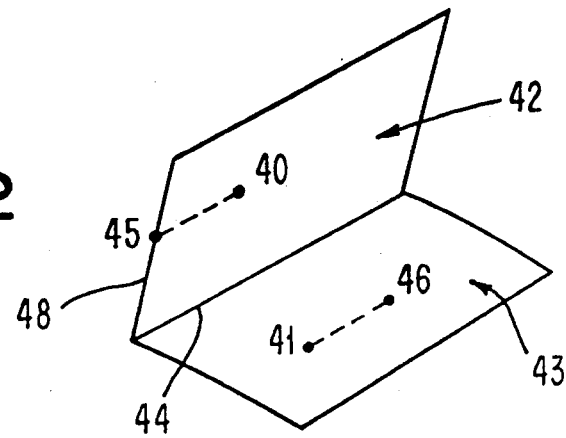
FIG. 12 is a perspective view of two faces illustrating the concept of surrogacy.

FIG. 12 illustrates an example of the concept of surrogacy. Two points, 40 and 41, belong to faces 42 and 43 that are not transversal which follows easily since they share the common edge 44, so that the intersection of the tangent spaces 42 and 43 contains the line parallel to 44. Thus, moving from point 40 in the direction parallel to edge 44 towards edge 48 until point 45 on edge 48 is reached and moving in the opposite direction the same distance from point 41 to reach point 46 shows that 45 and 46 are surrogates for 40 and 41. In fact, if faces 42 and 43 are not co-planar, then 45 and 46 are surrogates for 40 and 41 in the transversal cells, 48 and 43.

Some of the morphological transformations previously discussed involve Minkowski sums of the closure of complements of polyhedra. Not both a polyhedron and the closure of its complement can be bounded. Thus, although the classical polyhedra in $R^3$ are often defined to be bounded, the polyhedra herein defined of necessity include unbounded point sets. In fact, even $R^n$ itself is a polyhedron under this definition. Of course, an unbounded polyhedron cannot be decomposed as a finite union of bounded sets, but for the purposes of the previous discussion, a less stringent property suffices: that any polyhedron can be decomposed into finitely many polyhedra each of which contains no affine line. To see that such a decomposition can be easily found and at worst involves only a small number of polyhedra, consider T, the standard simplex in $R^n$, that is the convex set in $R^n$ generated by the $n+1$ points, $S = \{p_0, \ldots, p_n\}$, where $p_0$ is the origin and each other $p_i$ has 1 for its i-th coordinate with the rest being 0. For $n=2$, for example, T is the triangle with vertices (0,0), (1,0) and (0,1). For $n=3$, T is the tetrahedron with vertices (0,0,0), (1,0,0), (0,1,0), and (0,0,1). In general, T is a polyhedron and its minimal cell decomposition, K, has one n-cell to which the point, b, all whose coordinates equal $1/(n+1)$, belongs. K has $n+1$ (n−1)-cells, $c_0, \ldots, c_n$, where each $c_i$ is the interior of the convex set generated by all the points of S except $p_i$. Each of the cones, $U_i$, with vertex, b, and cross section, $\bar{c}_i$, is an unbounded polyhedron that is closed and convex and is easily seen to contain no affine lines. $R^n$ is the union of the cones, $U_i$, so that by intersecting any polyhedron, P, including $R^n$ itself, with these cones, a decomposition, $P = \cup P_i$, of P as the union of at most $n+1$ polyhedra, none of which contains an affine line, is obtained. In fact, since each $U_i$ is convex, P is decomposed into polyhedra none of which contain an affine line in its convex closure. If a cell, c, in one of the polyhedra of this decomposition is contained in the boundary of one of the cones, it will be contained in each of the other polyhedra defined by intersecting every other cone that shares this boundary. Unless c bounds a higher dimensional cell in each of these other cones, it will be pleonastically represented. To avoid this, we assume that any such cell is deleted from all polyhedra for which it does not bound a higher dimensional cell, unless there are no such polyhedra, in which case it is deleted from all except one polyhedron. Since the Minkowski sum distributes over unions, $P \oplus Q = \cup Q \oplus P_i$ for any polyhedron, Q, so that the Minkowski sum of two general polyhedra can always be obtained from the collection of polyhedra of this decomposition.

The subsequent techniques and algorithms described herein generally require that one of the polyhedra contain no line in it or in its convex closure. Thus, for clarity and simplicity of statement, in successive flow diagrams and pseudocode implementations, we will assume that one of the polyhedra has been decomposed by this technique without explicit mention, so that the input polyhedra will possess these properties.

It is now possible to describe an algorithm that can compute the Minkowski sum of two general polyhedra P and Q in $R^n$. First, if both P and Q possibly contain affine lines, then decompose P as the union of a finite set, S, of polyhedra, where it is known that no polyhedron of S contains an affine line. If either P or Q or both are known to contain no affine lines, then let S be the set containing only the polyhedron, P. Next, for each p in S calculate the union of the Minkowski sums of all pairs of transversal cells, c and d, where c is in p and d is in Q. Transversality is checked by testing, if the intersection of T(c) and T(d) equals the singleton set, {0}. $c \oplus d$ is calculated by use of the previously described algorithm for the calculation of the Minkowski sum of transversal cells. This union equals $p \oplus Q$. Finally, the Minkowski sum of P and Q is obtained by taking the union of $p \oplus Q$ for all p in S.

The performance of any algorithm is improved by avoiding unnecessary computation when possible. In particular, since cells whose dimensions sum to greater than n cannot be transversal, such pairs can easily be avoided. Moreover, since the algorithm that computes the Minkowski sum of two transversal cells in fact computes the Minkowski sum of the closures of the cells, the performance of the general algorithm is improved by considering higher dimensional cells first and remembering that their boundary cells need not be recomputed.

FIG. 13 is a flow diagram illustrating an embodiment of this method. The process begins by inputting the general polyhedra, P and Q, in n-space in function block 57 and then initializing the polyhedron X to be an empty set in function block 58 before entering a nested set of loops at function block 59. The following pseudocode fragment implements the flow diagram and, as before, a description of the constituent parts of the pseudocode and their relationship to the flow diagram immediately follows the fragment.

```
01  General_Minkowski_Sum(P,Q)
02  sum=Make_New_Polyhedron
03  for j=Dim(P) down_to 0 repeat
04      for c in Cells(P,j) repeat
05          for k=Minimum(n−j,Dim(Q)) down_to 0 repeat
06              for d in Cells(Q,k) repeat
07                  if (Transversal(c,d) and not Marked_As_
                        Done(c,d))
08                  then {new_sum=Transversal_Minkowski_
                        Sum(d.d)
09                  sum=Union(sum,new_sum)
10                  for e in c.bdry_pointers repeat
11                      for f in d.bdry_pointers repeat
12                          Mark_As_Done(e,f)}
13  return(sum)
```

In this pseudocode fragment, the following subroutines occur:

General_Minkowski_Sum, which accepts as input two general polyhedra in $R^n$ and returns the polyhedron that is the Minkowski sum of the two;

Make_New_Polyhedron, which creates a polyhedron that is the empty set;

Minimum, which takes two non-negative integers as input and returns the minimum of the two;

Transversal, which accepts as input two cell structures, computes the intersection of their tangent spaces, and returns the value true if the intersection is $\{0\}$ and false, otherwise;

Mark_As_Done, which accepts as input a pair of pointers to cell structures and marks a table to the effect that the pair of cell structures corresponding to the pair of pointers has been processed in Transversal_Minkowski_Sum;

Marked_As_Done, which accepts a pair of cell structures as input, accesses the table of Mark_As_Done, and returns the value true if the pair of cell structures has been processed by Transversal_Minkowski_Sum and false, otherwise; and finally, Union, which is assumed to be a call to the underlying geometrical modeler that accepts as input two polyhedra and returns their Boolean union.

The pseudocode has the following relationships with the flow diagram of FIG. 13. The first line of the pseudocode implements block 57, wherein two general polyhedra, P and Q, of n-space are input. The second line implements block 58, wherein an empty polyhedral structure is created. Lines 3 to 12 implement the outermost loop 72, wherein a loop is indexed by j which decreases from the dimension of P to 0, where j corresponds to the dimension of a cell, c of P, to be used within blocks 64 and 65. Lines 4 through 12 implement the next loop 73, wherein a cell, c of P, of dimension, j, is chosen. Block 61, wherein m, the upper index of loop 74, is set to the minimum of $n-j$ and the dimension of Q, is implemented by a call to subroutine Minimum in line 5. Lines 5 through 12 implement the next loop 74, wherein a loop is indexed by k which decreases from m to 0, where k corresponds to the dimension of a cell, d of Q, to be used within blocks 64 and 65. Lines 6 through 12 implement the inner most loop 75, wherein a cell, d of Q, of dimension, k, is chosen. The index range of k is limited to m, because any cell of Q with larger dimension cannot be transversal to a j-cell of P or Q has no cells of larger dimension. Decision block 64 is implemented by the if-then construction of lines 7 and 8 and enabled by lines 10 to 12, wherein all lower dimensional previously processed pairs of cells are marked. The computation of the Minkowski sum of transversal cells of block 65 is implemented by a call to subroutine Transversal_Minkowski_Sum in line 8. Block 66, wherein the newly calculated Minkowski sum is unioned with the union of those previously calculated, is implemented in line 9. Finally, block 71, is implemented by line 13.

Figure 14B:
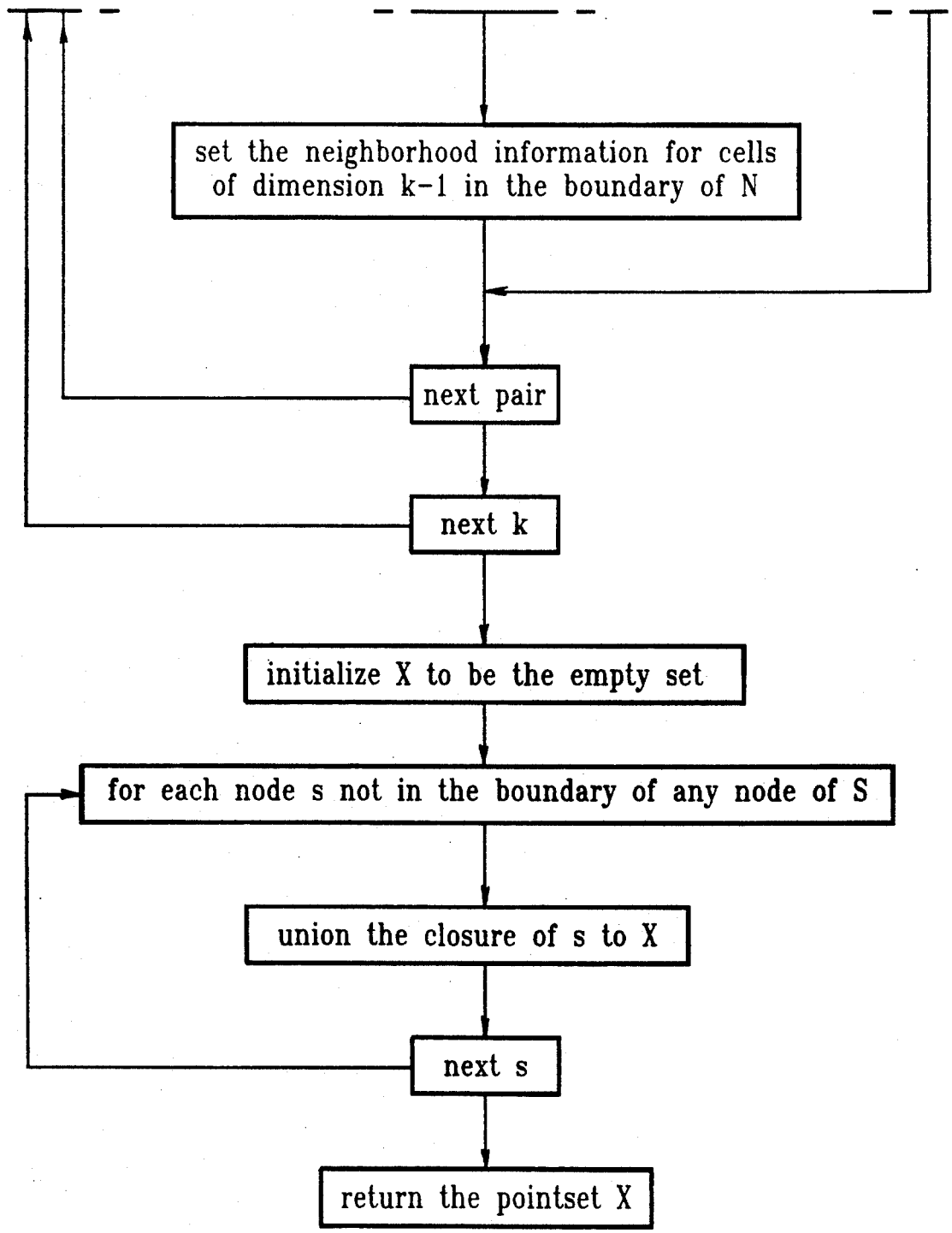

Although by structuring the algorithm for the Minkowski sum of general polyhedra to proceed by decreasing dimension of cells as in FIG. 13 reduces the number of pairs of cells whose Minkowski sum is computed more than once, it cannot avoid this problem. In fact, whenever two cells, c and d, of P share a common boundary cell, e, and c and d are both transversal to a cell, f, of Q, then invoking the algorithm for the Minkowski sum of general polyhedra which invokes the algorithm for the Minkowski sum of transversal cells will result in $e \oplus f$ being calculated twice; once in the calculation of $c \oplus f$ and once in the calculation of $d \oplus f$. These redundant calculations can be expensive but are difficult to eliminate when the functions and controls of the two algorithms are cleanly divided. However, by combining the two, this type of redundant calculation can be completely eliminated. Begin by calculating the 0-cells of $P \oplus Q$, that is the sum of the vertices of P and Q, store these cells, and create a means to reference a computed cell by the two cells whose Minkowski sum it is, as was accomplished in the pseudocode implementing FIG. 11. Do the same for the 1-cells of $P \oplus Q$; that is, follow the method in the algorithm for transversal cells that is embodied in FIG. 11 to create the cells while using the means of referencing the 0-cells of $P \oplus Q$ established in the previous step to avoid recalculating them as was accomplished in the pseudocode fragment of lines 1 through 31 that implemented the flow diagram of FIG. 11, store the cells, and update the references to computed cells. Next for each cell, c, of P and cell, d, of Q whose dimensions sum to two and which are transversal, repeat the process, and for those which are not transversal, mark all pairs, C in P and D in Q, which are bound by c and d as not transversal. Continue until cells in $P \oplus Q$ whose dimension equals the sum of the dimension of P plus the dimension of Q have been constructed or the dimension n is reached, whichever comes first. Now, for each cell that has been computed that does not lie in the boundary of any other cell, create the polyhedron defined by it and all the cells in its boundary, and finally take the union of these polyhedra. FIG. 14 is a flow diagram illustrating this combined method.

The observation that in the calculation of Minkowski sums of polyhedra the contribution due to the Minkowski sums of pairs of cells which are not transversal can be ignored is key to the justification of the correctness of this algorithm. In fact, without affecting the correctness of the general algorithm, the Minkowski sums of a wider class of pairs of cells can be ignored for improved efficiency. For this purpose, if c is a cell of a polyhedron, P, and d is a cell of a polyhedron, Q, then define c and d to be strongly transversal with respect to P and Q, if there exists no transversal affine cells, C and D, such that as point sets, $c \subseteq C \subseteq P$ and $d \subseteq D \subseteq Q$, or equivalently, if all affine cells, C and D, such that $c \subseteq C \subseteq P$ and $d \subseteq D \subseteq Q$, are transversal. For example, if e is a concave edge of a polyhedron, P, in $R^3$, then there are affine 2-cells contained in P which contain e. Thus, if f is a face of a polyhedron, Q, in $R^3$, then e and f are not strongly transversal with respect to P and Q, since two 2-cells are never transversal in $R^3$. Strong transversality implies transversality, while the converse is not true. Edge e will be transversal to each face of Q to which it is not parallel. Determining if two cells in two polyhedra are strongly transversal is more complex than determining if the two cells are transversal, but modelling systems often maintain information that aids in this determination. For example, in three-dimensional modelling systems, the full three-dimensional neighborhood of edges and vertices is often available and, as in the example of concave edges, this information can be sufficient to determine strong transversality.

In a manner similar to the previous discussion of nontransversal pairs of cells, it can be shown that if at least one of two polyhedra, P and Q, contains no affine lines in its convex closure, then only the contribution to $P \oplus Q$ of the Minkowski sums of pairs of cells that are strongly transversal with respect to P and Q need be considered; that is, that pairs of cells that are transversal but not strongly transversal can be ignored. As noted previously, the algorithm for computation of a decomposition that used the standard n-simplex yields this more powerful decomposition, so that no further algorithms nor analysis are necessary to assume that the required property holds for P or Q. In fact, to obtain an algorithm taking advantage of this reduction to considering only strongly transversal pairs of cells, a single change in block 64 of FIG. 13 or line 7 of its pseudocode implementation suffices. Specifically, the first conditional of block 64 or the call to subroutine Transversal in line 7 should first test whether the two cells are transversal, and if not return the information that the cells are not strongly transversal. Next, if the two cells are transversal, and it can not be ascertained whether they are strongly transversal or not, then it should be assumed that they are, and this is reported. The possibility of a false positive response will affect only the efficiency, not correctness. The remainder of the flow diagram of FIG. 13 or its pseudocode implementation remains unchanged. The algorithm represented by the flow diagram of FIG. 14 can also be enhanced by using reduction due to strong transversality. In particular, block 80 of the flow diagram of FIG. 14 should be modified in the manner of block 64 of the flow diagram of FIG. 13. The propagation of nontransversality of block 80 can remain for cell pairs found to be nontransversal. However, if a cell pair is transversal, but not strongly transversal, nontransversality should not be propagated.

The reduction inherent in treating only the strongly transversal cells rather than all transversal cells can provide significant increases in efficiency. For example, consider the following. Begin with a checkerboard pattern of 8 by 8 unit squares in the x-y plane. Sweep the pattern along the z-axis one unit, and keep the 32 unit cubes swept out by the black squares. Sweep the pattern another one unit along the z-axis, and this time keep the 32 unit cubes swept out by the red squares. Continue in this manner to obtain a three-dimensional checkerboard of 8 by 8 by 8 unit cubes, and call this polyhedron P. Let Q be a ¼ by ¼ by ¼ cube none of whose edges are parallel to a coordinate plane. Each edge of P is transversal to each face of Q, and so the original algorithm would calculate the Minkowski sum of the edge and the face, and use the result in the union defining the Minkowski sum of P and Q. It is easy to see that each edge that is not in the convex hull of P is in the closure of two co-planar faces of P, so that it is contained in a 2-cell that is contained in P. Moreover, each vertex that is not in the wire frame of the convex hull of P is in the closure of two co-linear edges of P, so that it is contained in a 1-cell that is contained in P. Thus, none of these edges can be strongly transversal to any face of Q, and none of these vertices can be strongly transversal to the interior of Q, so that the enhanced algorithm will avoid these calculations.

Figure 15:
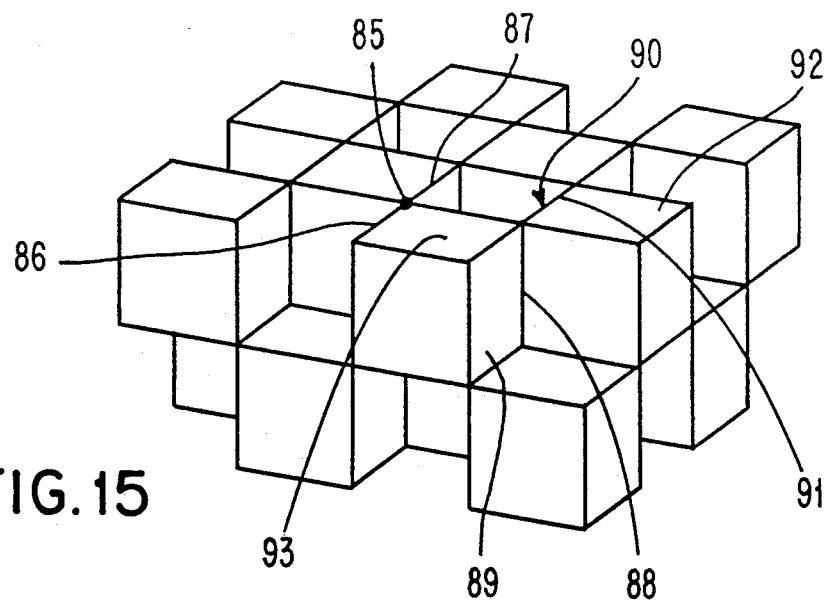
FIG. 15 is an orthographic view of a portion of a polyhedron formed by translating a checker board pattern.

FIG. 15 is a representation of a portion of the polyhedron, P, described above. Vertex 85 is contained in the interior of the line segment defined by the union of 85 and the co-linear edges 86 and 87 so that it cannot be strongly transversal to any solid. Similarly, if face 90 is the face with edges 88 and 91 in its boundary, then, because edge 88 is in the interior of the 2-cell defined by the union of 88 and co-planar faces 89 and 90, edge 88 cannot be strongly transversal to any face.

If we generalize the above to an m by m checkerboard and m by m by m collection of cubes, then the number of edges is $3m(m+1)^2 - 6m$, while the number of edges that need to be considered (those in the convex hull) is $12m(m+1) - 18m$. Thus, the first increases like $m^3$ and the other like $m^2$. Moreover, there are $(m+1)^3 - 4$ vertices, of which only 12m-8 need be considered; i.e., are in the wire frame of the convex hull. For the example m=8, the two edge numbers are 1896 and 720, or about 30%. For m=100, it is about 4%. For the example, the two vertex numbers are 725 and 88, or about 12%. For m=100, it is about 0.1%.

Since we have now completed a description of an embodiment of the general algorithm, we turn to a consideration of two commonly occurring special cases for which simpler and more efficient algorithms are presented: the case when one of the polyhedra is full dimensional and the case when one of the polyhedra is convex. We begin with full dimensional polyhedra, the class of polyhedra most often encountered in practice.

Special Case of the Minkowski Sum When One of the Polyhedra is Full Dimensional

A polyhedron, P, in $R^n$ is full dimensional, if the union of the closures of the n-cells of P yields P. A decomposition, K, of a full dimensional polyhedron, P, in $R^n$ is a full dimensional decomposition, if each k-cell in K is in the boundary of a (k+1)-cell of K for all k<n. Many commercial polyhedral solid modelers support only full dimensional polyhedra in $R^3$ represented by a full dimensional decomposition. Any decomposition of a full dimensional polyhedron can be "cleaned" or "simplified" to produce a full dimensional decomposition. For simplicity of exposition, when we speak of a full dimensional polyhedron, it will be assumed to be represented by its simplified, and hence full dimensional, decomposition.

Figure 16:
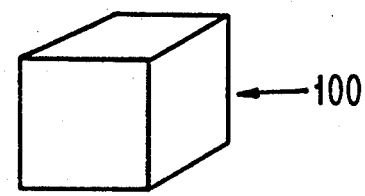
FIG. 16 is an orthographic view of a cube.
Figure 17:
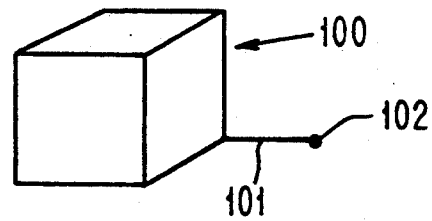
FIG. 17 is an orthographic view of a polyhedron formed by the cube, an edge and a vertex.
Figure 18:
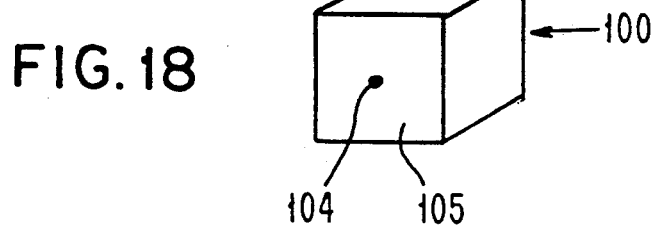
FIG. 18 is an orthographic view of a polyhedron formed by a cube and a vertex.

FIG. 16 shows a cube 100 which is a full dimensional polyhedron with a full dimensional decomposition. FIG. 17 shows the cube 100 with edge 101 and vertex 102 added to form polyhedron P. Since edge 101 and vertex 102 do not belong to the boundary of any 3-cell in P, P is not full dimensional. FIG. 18 shows cube 100 with vertex 104 added to face 105 to produce a cell decomposition of cube 100 which is different than the decomposition of FIG. 16. Since vertex 104 is a 0-cell, but is not in the boundary of any edge, that is, a 1-cell, of the cell decomposition of cube 100, this cell decomposition is not a full dimensional decomposition. If this decomposition is simplified, one obtains FIG. 16.

Figure 19:
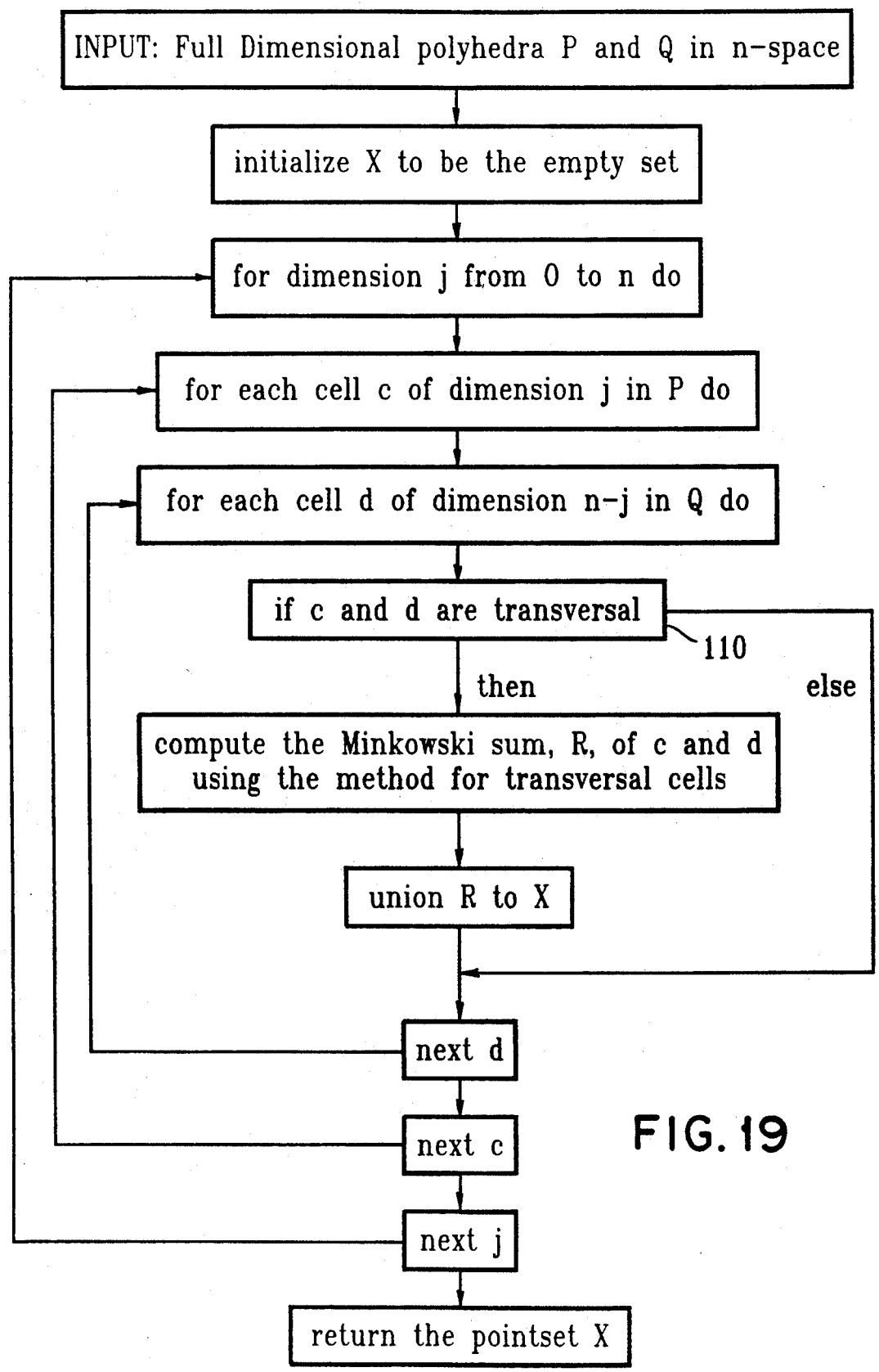
FIG. 19 is a flow diagram illustrating a modification of the general process of FIG. 13 for the case of full dimensional polyhedra.

In the general algorithm for the computation of the Minkowski sum of two polyhedra it is necessary to consider all pairs of transversal cells the sum of whose dimensions is less than or equal to n. If at least one of the polyhedra is known to be a full dimensional polyhedron however, the situation is simpler. (The application of the method to reduce a polyhedron to the sum of polyhedra containing no affine lines in its convex closure returns a collection of full dimensional polyhedra, if it is applied to a full dimensional polyhedron, so that we can assume that this method has been applied, if necessary.) Let P and Q be polyhedra in $R^n$, at least one of which contains no affine lines in its convex closure. If P is full dimensional, and c is a j-cell in P which is transversal to d, a k-cell in Q, with j+k less than n, then it can be shown that either c is not strongly transversal to d, and so c⊕d can be ignored, or c is in the closure of C, an (n−k)-cell of P, that is strongly transversal to d. This implies that the general algorithm can be simplified in two ways. First, the contribution to P⊕Q from pairs of cells whose dimension does not sum to n can be ignored; and second, since the gain in efficiency due to marking cell pairs as previously encountered applied to transversal cell pairs used to create a boundary cell and hence the sum of them must be less than n, so that they would not be processed because of the first observation. Thus, one computes the Minkowski sum as the union of the Minkowski sum of transversal (or strongly transversal) cell pairs whose dimensions sum to n and do no marking. Thus, the modification shown in the flow diagram of FIG. 19 contains the modification of the flow diagram of the general algorithm of FIG. 13, and the following code modifies the implementation of the general algorithm.

```
01  Minkowski_Sum_With_Full_Dimensional_
        Polyhedron(P,Q)
02  sum = Make_New_Polyhedron
03  for j = 0 to n repeat
04     for c in Cells(P,j) repeat
05        for d in Cells(Q,n−j) repeat
06           if Transversal(c,d)
07              then {new_sum = Transversal_Minkowski_
                    Sum(c,d)
08                    sum = Union(sum,new_sum)}
09  return(sum)
```

An implementation in terms of strong transversality is obtained by changing block 110 and its implementation in line 6, as outlined above in the discussion of the corresponding enhancement of the general algorithm.

Most applications of polyhedral modelling are currently implemented for $R^3$. In this setting, the 0-, 1-, 2-, and 3-cells are referred to as vertices, open edges, open faces, and open solids, and the closures of the 1-, 2- and 3-cells as simply edges, faces, and solids. When the polyhedra involved are full dimensional, they are usually called solids, and the use and manipulation of these solids, called solid modelling. If A and B are two three-dimensional polyhedra, then denote by $V_A$ the vertices of A and by $V_B$ the vertices of B. Similarly, denote by $E_A$, $E_B$, $F_A$, and $F_B$ the edges and faces of A and B, respectively. If A or B is a solid, and one of them contains no affine lines in its convex closure (for example, if it is bounded), then the previous algorithm can be symbolically represented as $$A \oplus B = (A \oplus 'V_B) U (F_A \oplus 'E_B) U (E_A \oplus 'F_B) U (V_A \oplus 'B),$$

where $\oplus'$ denotes the process of taking the union of the Minkowski sum of all pairs of transversal (or strongly transversal) cells from the two operands. Since concave edges are never strongly transversal to faces, by using the fact that the Minkowski sum distributes over unions, it can be shown that $$A \oplus B = (A \oplus E'_B) U (E'_A \oplus B),$$

where $E'_A$ denotes the set of non-concave edges of A, $E'_B$ denotes those of B. The Minkowski sum of a vertex and a solid is nothing more than a translation. The Minkowski sum of a face and a transversal edge is generally called sweeping a face along a edge. The Minkowski sum of a solid and an edge is generally called sweeping a solid along an edge. There are many commercially available implementations supporting polyhedral solid modelling. Many of them can perform unions, translations, and sweeps. Thus, any one of these could serve as an implementation vehicle in this case.

Although we have expressed these algorithms for Minkowski sums involving full dimensional polyhedra without the enhancement using strong transversality, the same potential for improvement of efficiency can be gained here by its application. In fact, the three-dimensional checker board example indicating the potential gains that was presented when strong transversality was discussed, involved full dimensional three-dimensional polyhedra, i.e., solids.

Special Case of the Minkowski Sum When One of the Polyhedra is Convex

Often in applications of Minkowski sums, one of the objects is known to be convex. For example, shaping and offset operations frequently employ a polyhedral approximation to a ball. Many path planning algorithms begin by enclosing the object in a polyhedral approximation to an ellipsoidal solid. The importance of these applications, and others, make it desirable to offer an improved algorithm yielding greater efficiency. As before, greater computational efficiency is obtained by reducing the number of pairs of cells that must be considered, in this case by taking advantage of properties of convex polyhedra.

We begin by defining several terms we will require. A linear transformation, L, is an annihilator of a subspace, W, if $L(x) = 0$ if and only if x is in W. Every subspace has annihilators. If L is an annihilator of W, then it follows that the difference of two points, p and q, is a vector of W if and only if $L(p) = L(q)$. If L is an annihilator of W, and S and T are two sets such that $L(S) = L(T)$, then it is easy to see that $L'(S) = L'(T)$ where L' is any annihilator of W. Thus, for any annihilator, L, of W, and any two sets (or collections of sets), S and T, we define S and T to be equivalent modulo W, if $L(S) = L(T)$.

The calculation of a Minkowski sum involving a convex polyhedron can be reduced to Minkowski sums involving simpler subsets by using the concept of equivalence modulo a subspace. In particular, let d be a cell of a polyhedron in $R^n$ and S be a collection of subsets of a polyhedron, P, that is equivalent to P modulo T(d). For any point, p, of P, equivalence modulo T(d) implies that there must be a point s in one of the subsets of S such that $p + v = s$ for some vector, v, in T(d). If P is convex, then each point in the line segment connecting p and $p + v$ is also in P. If q is any point of d, then, since $p + q = (p + tv) + (q − tv)$, it follows that either $p + q$ is contained in $S \oplus d$, or $p + q$ is contained in $P \oplus \delta d$. Thus, in the computation of $P \oplus d$ by the general algorithms that have been presented, $P \oplus d$ can be replaced by $S \oplus d$. If for an affine cell, c, and a polyhedron, Q, we define a set (or collection of sets), T, to be a surrogate of Q for c, whenever $Q \oplus \bar{c} = (T \oplus c) U (Q \oplus \delta c)$, then the preceding implies that any subset or collection of subsets of P that is equivalent to P modulo T(d) is a surrogate of P for d. Of course, if S is a surrogate of P that is simpler than P, then using S rather than P yields a more efficient calculation of $P \oplus \bar{d}$.

For a k-cell, d, let L be an annihilator of T(d). L can be utilized in two ways to determine a simpler surrogate of a convex polyhedron, P, for d. If P contains affine lines, then an application of the previously described algorithm for a decomposition as a union of polyhedra containing no affine lines will return a collection of convex sets. If we obtain surrogates for each of these sets, then the concatenation of these surrogates forms a surrogate of P for d, so that hereafter we may assume that P contains no affine lines. If j is the dimension of P, and m is the dimension of the intersection T(P) and T(d), then it can be shown that L(P)=[L(cells(P,j−m))], if P contains no affine lines. Moreover, any subset of cells(P,j−m) such that the closure of the union of the images under L of the members of the subset covers L(cells(P,j−m)) suffices. Such subsets consisting of cells transversal to d can easily be determined, since this condition is easily checked within a modeler. Thus, a simpler surrogate can be obtained in terms of cells in the decomposition of P Alternatively, a simpler surrogate can be formed in terms of cells which may not belong to the decomposition of P, but rather which are determined by a decomposition of L(P). If P is bounded, the L(P) is also bounded, so that L(P) can be decomposed as a collection, $\{T_i\}$, of (j−m)-simplices. For each simplex $T_i$ in the collection a (j−m)-simplex $S_i$ P can be found such that $L(S_i)=T_i$. The collection $\{S_i\}$ is then a surrogate of P for d. If P is not bounded, then a similar technique using the convex closures of sets of half lines and points in place of the simplices can be employed, or the problem can be reduced to the bounded case by a projective transformation.

Three cases merit special mention. First, when j−m=0, then T(P) is a subset of T(d), so that L(P) reduces to a single point. Every point in P maps to this point, and so any point, p, in P can serve as a surrogate of P for d. Thus, P⊕d can be replaced in the computation of P⊕$\bar{d}$ by p⊕$\bar{d}$; that is, $\bar{d}$ translated by p. In particular, when $\bar{d}$ is full dimensional, then T(d) coincides with $R^n$, so that j−m=0, and any point of P can serve as a surrogate of P for d. Second, when j−m=1, L(P) is a subset of a line. P is convex, so that it is connected, and thus L(P) is a line, a half line or a line segment. Since P contains no affine lines, P must contain a vertex, and each vertex bounds an edge. If f is any one of the linear functions that implicitly define T(d) for which f(P) does not reduce to a point, then let $v_{max}$ be a vertex of P such that $f(v_{max})$ maximizes the value of f over all vertices of P, and $v_{min}$ be a vertex of P such that $f(v_{min})$ minimizes the value of f over all vertices of P. Let S be an empty collection of sets. If $v_{max}$ bounds an open half line in cells(P,1) that contains a point, p, with $f(p)>f(v_{max})$, then append one such the half line to S. If $v_{min}$ bounds an open half line in cells(P,1) that contains a point, p, with $f(p)>f(v_{max})$, then append one such the half line to S. If $v_{min}$ bounds an open half line in cells(P,1) that contain a point, p, with $f(p)<f(v_{min})$, then append one such the half line to S. If $f(v_{max})=f(v_{min})$, then append $v_{max}$ to S, and otherwise append $v_{max}$, $v_{min}$, and the open edge connecting them to S. S is now a surrogate of P for d. Third, when P is bounded, and the number of vertices of L(P) equals j−m+1, then L(P) is a simplex, so that P contains a simplex defined by m−j+1 vertices of P that is a surrogate of P for d.

To complete the set of techniques used when one of the polyhedra is convex, we require a method for determining an annihilator of the tangent space of a cell. Fortunately, in any modelling system based on boundary representation, for any k-cell, d, of a polyhedron, a fixed annihilator of T(d) can always be determined. In a boundary based polyhedral modelling system, T(d) is represented either implicitly as the solution set of n−k linear functions or explicitly by k basis vectors. Since an explicit representation can be converted to an implicit one (for example by an application of the Gram-Schmidt process), in either case let $\{f_i\}$ be a set of linear functions that implicitly represents d. If L is the transformation that maps x in $R^n$ to $(f_1(x), \ldots, f_{n-k}(x))$, then L is an annihilator of T(d).

Figure 20:
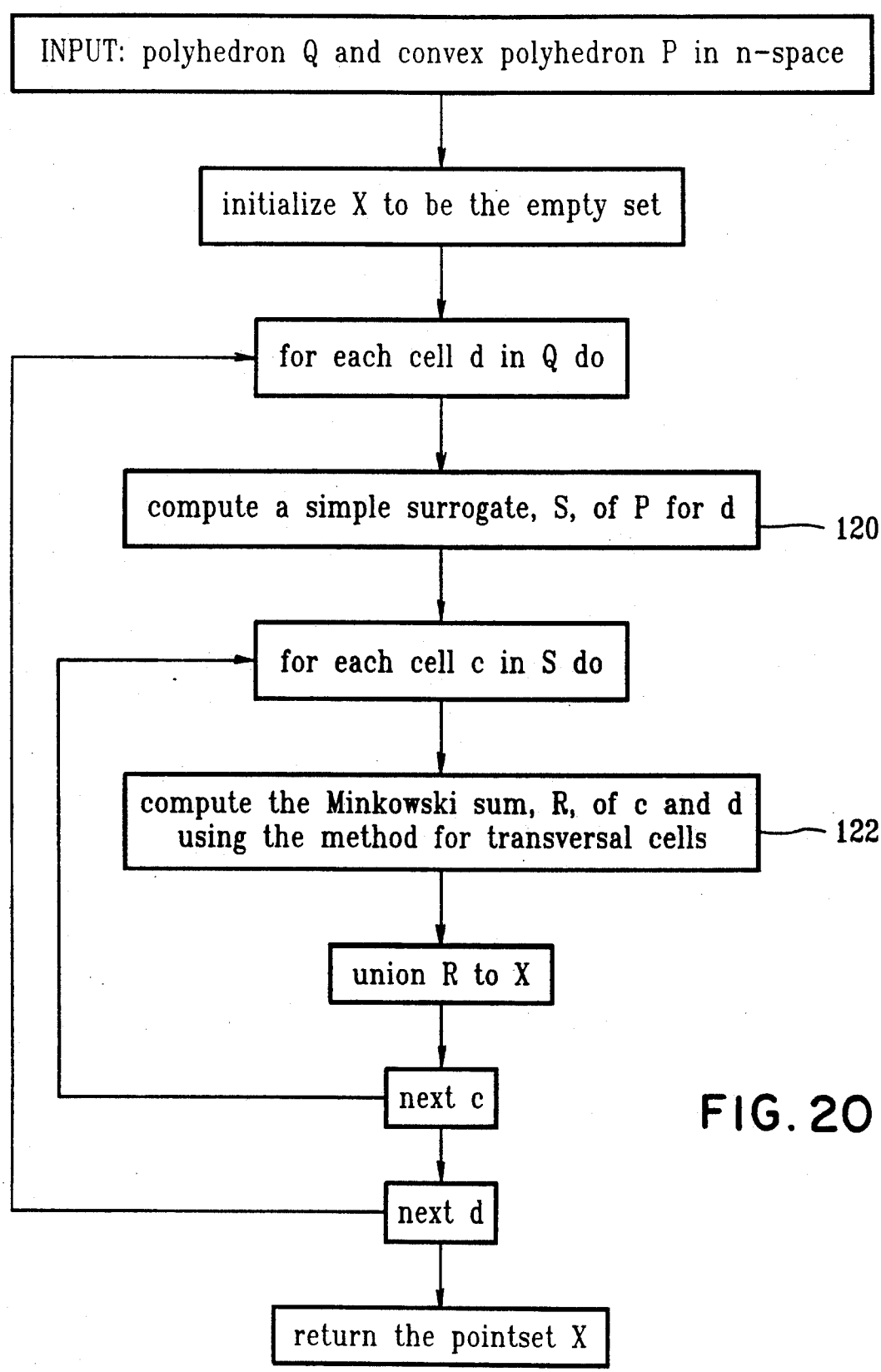
FIG. 20 is a flow diagram illustrating the computation of the Minkowski sum of a convex polyhedron and a general polyhedron.

FIG. 20 is a flow diagram showing the high level control of an implementation of this method for the computation of the Minkowski sum of a convex polyhedron and a general polyhedron. Block 120 implies the calculation of a simpler surrogate by means of the methods that have been described in previous paragraphs. The following pseudocode fragment is an example of an implementation of the flow diagram. In the pseudocode, P is assumed to be a convex polyhedron and Q to be a general polyhedron. Subroutine Simpler_Surrogate of line 4 accepts a convex polyhedron, P, and a cell, d, as input and returns a list of cell structures that represents a set of cells that is a simpler surrogate of P for d. This simpler surrogate is found by means of the methods described herein.

```
01  Minkowski_Sum_With_Convex_Polyhedron(P,Q)
02  sum = Make_New_Polyhedron
03  for d in Cells(Q) repeat
04    {list_of_cells = Simpler_Surrogate(P,d)
05    for s in list_of_cells repeat
06      sum = Union(sum,Transversal_Minkowski_
            Sum(s,d)}
07  return(sum)
```

When A and B are polyhedra in $R^3$ with A being convex and bounded, the previous method can be more explicitly described. The volumes of B, that is the 3-cells of B, are full dimensional, so that any point of A serves as a surrogate of A for any one of the volumes. Thus, the contribution to A⊕B due to any volume of B and A can be replaced by the volume translated by a point of A, but these can be simultaneously treated by the translation of B by any point of A. Each face, f of B, is two-dimensional, and so T(f) is implicitly defined by one linear equation. This is often stored as a normal vector (interior or exterior), or a normal vector can easily be derived. A is bounded, and so there can be no half lines in A. Thus, if $v_{max}$ is a vertex of A, whose dot product with v, a normal vector of f, is the maximum obtained for all vertices of A, and $v_{min}$ is a vertex of A, whose dot product with v is the minimum obtained for all vertices of A, then the line segment connecting $v_{max}$ and $v_{min}$ is a surrogate of A for f. In fact, if the maximum and minimum values obtained are equal, then $v_{max}$ (or $v_{min}$) alone suffices as a surrogate.

Figure 21:
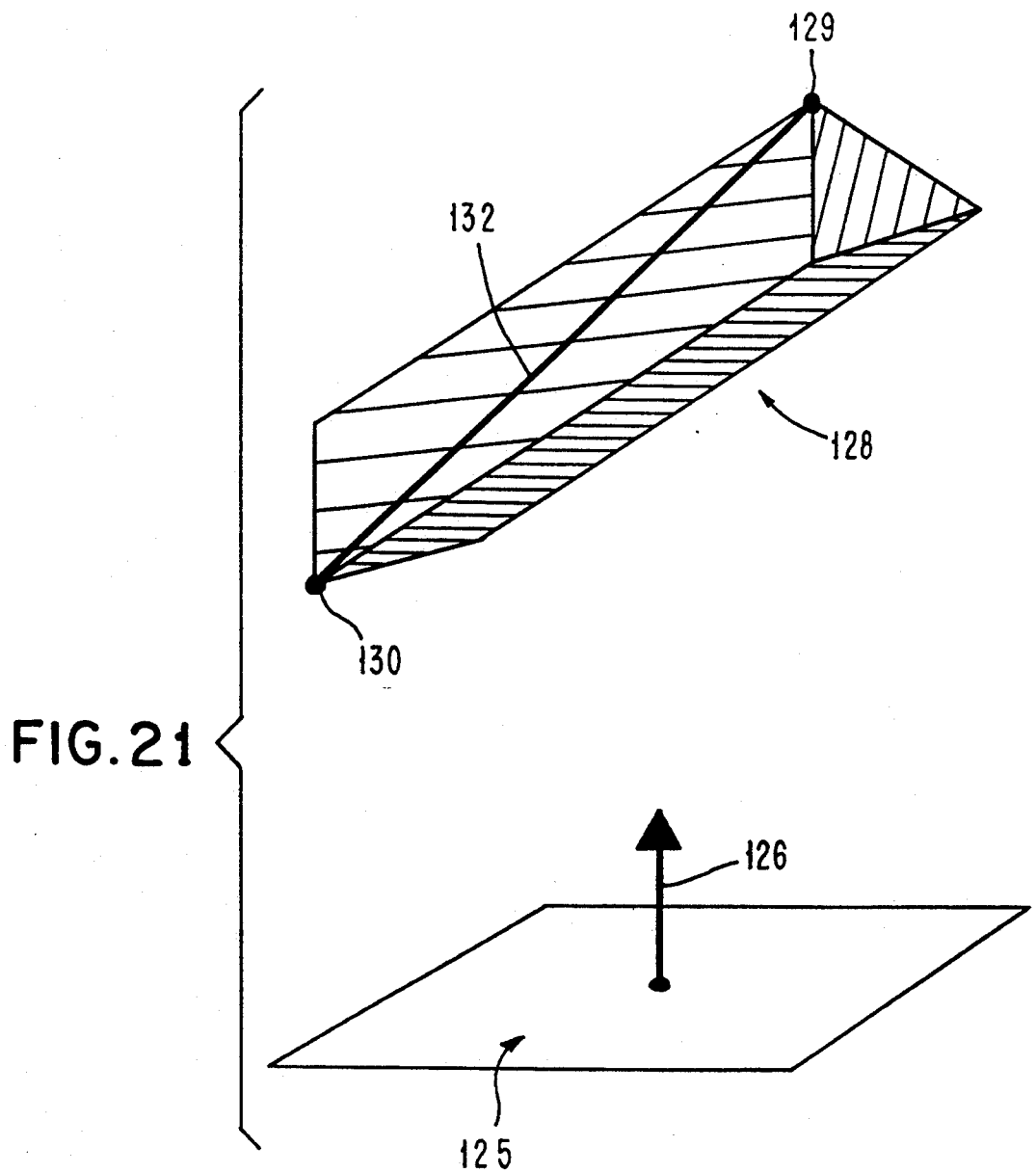
FIG. 21 is a perspective view of a planar object and a convex polyhedron illustrating by way of example the technique of FIG. 20.

FIG. 21 is an example of this technique. Cell 125 is a face with normal vector 126. Convex polyhedron 128 has vertex 129 which maximizes the dot product with vector 126. Convex polyhedron 128 also has a vertex 130 which minimizes the dot product with vector 126. The value of the dot product of vertex 129 and vector 126 is greater than the value of the dot product of vertex 130 and vector 126, so that line segment 132 connecting vertices 130 and 129 is a surrogate of convex polyhedron 128 for face 125.

Now let e be an edge of B, and v be the vector defined by the difference of its end points. As with the faces of B, a vector normal to a face of A can be easily obtained. If the dimension of A is three, then it can be assumed that the normal vector is an interior normal vector, and then the set of the closures of faces whose normal vector has a positive dot product with v is a surrogate subset of A for e. If the dimension of A is less than three, then, because A is convex, the faces of A transversal to e must be swept by e. On the other hand, for a face, f, of A that is not transversal to e a simpler surrogate can be found. In fact, if w is the cross product of v and the normal to f, then, if $v_{max}$ is a vertex of A, whose dot product with w, is the maximum obtained for all vertices of A, and $v_{min}$ is a vertex of A, whose dot product with w is the minimum obtained for all vertices of A, then the line segment connecting $v_{max}$ and $v_{min}$ is a surrogate of A for e. Finally, we note that A is transversal to e, if and only if the dot product of e with the normal to A is different from 0.

Figure 22:
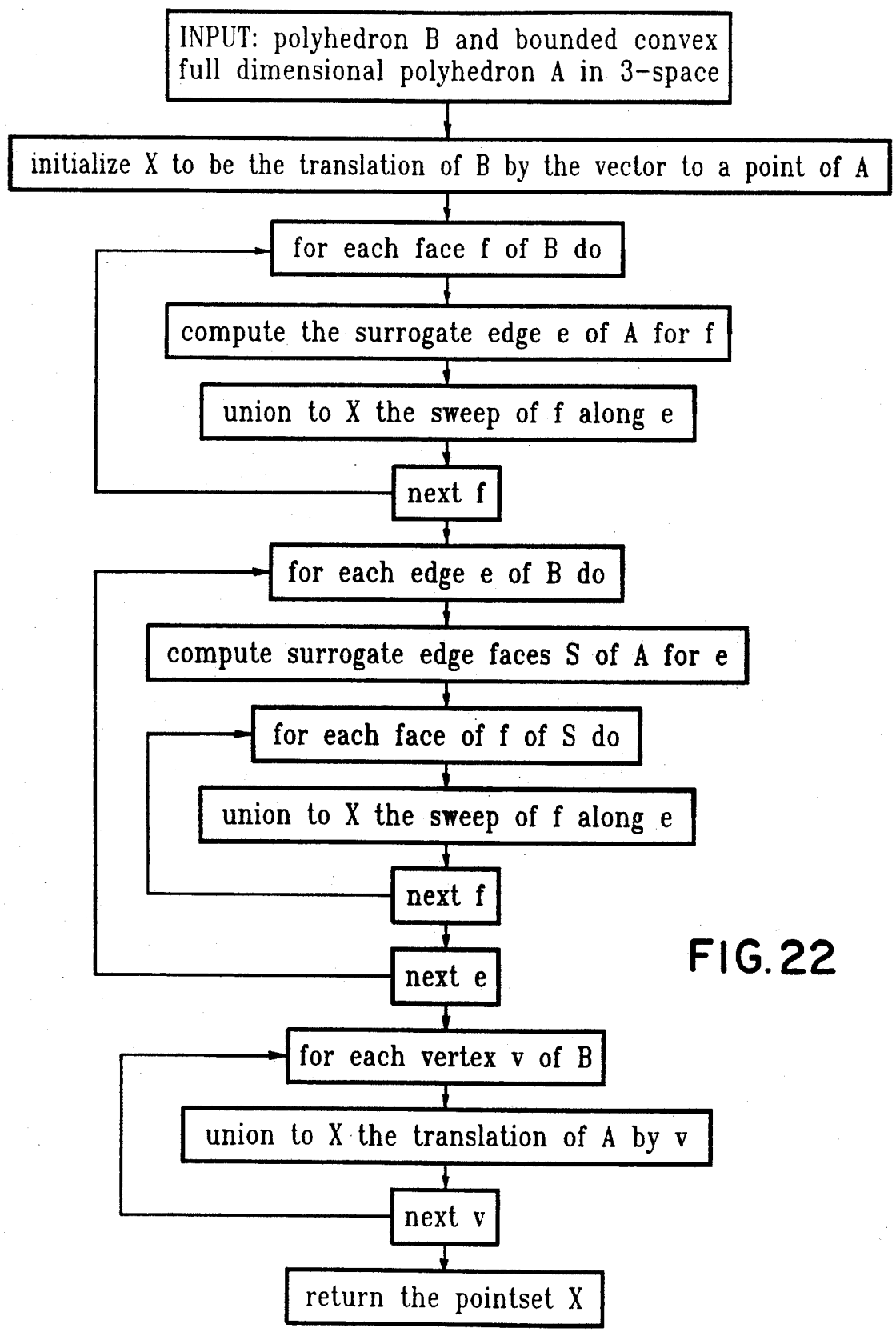
FIG. 22 is a flow diagram showing the computation of the Minkowski sum in 3-space with a bounded convex polyhedron.

FIG. 22 is a flow diagram of an algorithmic development of this method when one polyhedron is bounded, convex, and full dimensional. The following pseudocode is an implementation of the method when one polyhedron is convex and bounded, but not necessarily full dimensional, in terms of facilities commonly available in commercial modelling systems. In particular, A in line 1 is assumed to be a convex, bounded polyhedron of $R^3$ and B a polyhedron of $R^3$.

```
01  Minkowski_Sum_In_3_Space_Involving_A_Bounded_
02  Convex_Polyhedron(A,B)
03  sum=Translat(B,Point_Of(A))
04  for f in Faces(B) repeat
05    {u=Normal_To(f)
06    maximizing_vertex=Vertex_Maximizing_Dot_
07      Product(A,u)
08    maximum_value=Dot_Product(u,maximizing_vertex)
09    minimizing_vertex=Vertex_Minimizing_Dot_
      Product(A,u)
10    minimum_value=Dot_Product(u,minimizing_vertex)
11    if (minimum_value<maximum_value)
12    then {edge=Make_Edge(maximizing_vertex,
13      minimizing_vertex)
14      sum=Union(sum,Sweep(f,edge))}
15    else sum=Union(sum,Translate(f,maximizing_
        vertex))}
16  for e in Edges(B) repeat
17    v=Make_Vector_From_End_Points(e)
18    if (Dim(A)=3)
19    then for f in Faces(A) repeat
20      {u=Normal_To(f)
21      if (Dot_Product(u,v)>0)
22      then sum=Union(sum,Sweep(f,e))}
23    else {g=Face_Of(A)
24      u=Normal_To(g)
25      if (Dot_Product(u,v)=0)
26      then {w=Cross_Product(u,v)
27        maximizing_vertex=Vertex_Maximizing_
28          Dot_Product(A,w)
29        minimizing_vertex=Vertex_Minimizing_
          Dot_Product(A,w)
30        edge=Make_Edge(maximizing_vertex,
31          minimizing_vertex)
32        sum=Union(sum,Sweep(edge,e))}
33      else for f in Faces(A) repeat
34        sum=Union(sum,Sweep(f,e))}
35  for v in Vertices(B) repeat
36    sum=Union(sum,Translate(A,v))
37  return(sum)
```

While the invention has been described in terms of illustrative embodiments, those skilled in the art will understand that the invention may be practiced with modification within the spirit and scope of the appended claims.

Having thus described our invention, what we claim as new and desire to secure by Letters Patent is as follows:

1. In a CAD/CAM system including a computer for generating an image of a geometric object in a space which simulates a physical object being modeled on said CAD/CAM system, a method of generating said image comprising the computer performed steps of:
    inputting data to said CAD/CAM system which define first and second general polyhedra as a collection of cells which, when combined, form said geometric object;
    testing said data to determine the transversality of pairs of said cells;
    determining from the tested data if two cells are non-transversal, and if so, declaring pairs of cells in the respective boundaries of said two cells cannot be transversal;
    determining from the tested data if two cells are transversal, and if so, declaring all pairs of cells in their respective boundaries are transversal;
    forming Minkowski sums of those pairs of respective cells from each of said first and second general polyhedra which are transversal;
    forming a union of said Minkowski sums of the cells using Boolean operations to form a Minkowski sum of said first and second general polyhedra; and
    generating and displaying an image of a geometric object represented by said Minkowski sum of said first and second general polyhedra.

2. The method recited in claim 1 wherein said Minkowski sums are derived from transversal polyhedra in n-space using linear translational sweeps.

3. The method recited in claim 1 wherein said Minkowski sums are formed by processing cells starting from a lowest dimension and ending with highest dimensional cells, thereby eliminating a large fraction of redundant calculations.

4. The method recited in claim 1 wherein one of said general polyhedra is full dimensional and wherein the step of forming said Minkowski sums is performed only on pairs of cells whose dimensions sum to the dimension of the space.

5. The method recited in claim 1 wherein both said first and second general polyhedra are full dimensional polyhedra and wherein unions of Minkowski sums are formed by translations of each polyhedron by vertices of the other polyhedron and of sweeps of faces of each polyhedron by edges of the other polyhedron.

6. The method recited in claim 5 wherein only strongly transversal face edge pairs are used in said translations and sweeps.

7. The method recited in claim 1 further comprising the step of reducing unbounded polyhedra to a union of a finite number of polyhedra, each of which contains no affine line.

8. The method recited in claim 1 wherein the polyhedron A is expanded by the polyhedron B by the step of computing the Minkowski sum A⊕B to simulate a process of depositing a layer reflecting the characteristics of the polyhedron B on a substrate having the characteristics of the polyhedron A.

9. The method recited in claim 8 wherein the simulated deposition process represents a step in semiconductor manufacture and the step of generating and displaying an image provides a visual representation of the result of said simulated deposition process.

10. The method recited in claim 1 wherein the Minkowski sum A⊕B of two polyhedra A and B is formed and the polyhedron A is eroded by the polyhedron B further comprising the steps of:
    first computing a reflection of the polyhedron B through an origin as $B' = \{-b: b \in B\}$; and then computing the Minkowski sum $A \ominus B'$.

11. The method recited in claim 10 wherein the process of eroding a polyhedron A by the polyhedron B simulates an etching process in semiconductor manufacture and the step of generating and displaying an image produces a visual representation of said simulated etching process.

12. The method recited in claim 1 wherein the Minkowski sum $A \oplus B$ of two polyhedra A and B is formed and the polyhedron A is opened by the polyhedron B further comprising the steps of:
  first computing a reflection of the polyhedron B through an origin as $B' = \{-b: b \in B\}$; and next, computing the Minkowski sum of $(A \ominus B') \oplus B$.

13. The method recited in claim 1 wherein the Minkowski sum $A \oplus B$ of two polyhedra A and B is formed and the polyhedron A is closed by the polyhedron B further comprising the steps of:
  first computing a reflection of the polyhedron B through an origin as $B' = \{-b: b \in B\}$; and next, computing the Minkowski sum of $(A \oplus B') \ominus B$.

14. The method recited in claim 1 wherein the Minkowski sum $A \oplus B$ of two polyhedra A and B is formed and the process is used to determine a translational free space of the polyhedron B in the polyhedron A further comprising the steps of:
  first computing a reflection of the polyhedron B through an origin as $B' = \{-b: b \in B\}$; and next, computing the Minkowski sum of $A \ominus B'$.

15. In a computer modeling system including a computer for generating images of geometric objects in three-dimensions, said image generating computer receiving as inputs data generated by a computer based simulation system programmed to simulate a deposition process in semiconductor manufacture, a method for displaying said deposition process in semiconductor manufacture wherein a polyhedron A is expanded by a polyhedron B, said method comprising the computer performed steps of:
  inputting data from said simulation system to said computer modeling system which data define said polyhedrons A and B as a collection of cells which, when combined, form a geometric object;
  testing said data to determine the transversality of pairs of said cells;
  determining from the tested data if two cells are non-tranversal, and if so, declaring pairs of cells in the respective boundaries of said two cells cannot be transversal;
  determining from the tested data if two cells are transversal, and if so, declaring all pairs of cells in their respective boundaries are transversal;
  forming Minkowski sums of those respective cells from each of said polyhedra A and B which are transversal;
  forming a union of said Minkowski sums of the cells using Boolean operations to form the Minkowski sum $A \oplus B$ of the two polyhedra A and B, at least one of which is bounded, as the union of linear translational sweeps wherein said Minkowski sum is expressed as $A \oplus B = (A \oplus V_B) \cup (F_A \oplus E_B) \cup (E_A \oplus F_B) \cup (V_A \oplus B)$, where $V_A$, $E_A$ and $F_A$, respectively, and $V_B$, $E_B$ and $F_B$, respectively, denote the unions of vertices, edges and faces of the polyhedrons A and B;
  generating and displaying an image of a geometric object represented by said Minkowski sum, said image simulating said deposition process.

16. In a computer modeling system including a computer for generating images of geometric objects in three-dimensions, said image generating computer receiving as inputs data generated by a computer based simulation system programmed to simulate an etching process in semiconductor manufacture, a method for displaying said etching process in semiconductor manufacture wherein a polyhedron A is eroded by a polyhedron B, said method comprising the computer performed steps of:
  inputting data from said simulation system to said computer modeling system which data define said polyhedrons A and B as a collection of cells which, when combined, form a geometric object;
  testing said data to determine the transversality of pairs of said cells;
  determining from the tested data if two cells are non-tranversal, and if so, declaring pairs of cells in the respective boundaries of said two cells cannot be transversal;
  determining from the tested data if two cells are transversal, and if so, declaring all pairs of cells in their respective boundaries are transversal;
  computing the reflection of the polyhedron B through an origin as $B' = \{-b: b \in B\}$;

forming Minkowski sums of those respective cells from each of said polyhedra A and B' which are transversal;
  forming a union of said Minkowski sums of the cells using Boolean operations to form the Minkowski sum $A \oplus B'$ of the two polyhedra A and B, at least one of which bounded, as the union of linear translational sweeps wherein said Minkowski sum is expressed as $A \oplus B' = (A \oplus V_{B'}) \cup (F_A \oplus E_{B'}) \cup (E_A \oplus F_{B'}) \cup (V_A \oplus B')$, where $V_A$, $E_A$ and $F_A$, respectively, and $V_{B'}$, $E_{B'}$ and $F_{B'}$, respectively, denote the unions of vertices, edges and faces of the polyhedron A and the reflection B' of the polyhedron B; and
  generating and displaying an image of a geometric object represented by said Minkowski sum, said image simulating said etching process.

17. In a computer modeling system including a computer for generating images of geometric objects in three-dimensions, a method for simulating translational free space of a robotic gripper within a workcell, said workcell being represented by a polyhedron A and said robotic gripper being represented by a polyhedron B, said method comprising the computer performed steps of:

inputting data to said computer modeling system which define said polyhedrons A and B as a collection of cells which, when combined, form a geometric object;

testing said data to determine the transversality of pairs of said cells;

determining from the tested data if two cells are nontransversal, and if so, declaring pairs of cells in the respective boundaries of said two cells cannot be transversal;

determining from the tested data if two cells are transversal, and if so, declaring all pairs of cells in their respective boundaries are transversal;

computing the reflection of B through an origin as $$B' = \{-b: b \in B\};$$

forming Minkowski sums of those respective cells from each of said polyhedra A and B' which are transversal;

forming a union of said Minkowski sums of the cells using Boolean operations to form the Minkowski sum A⊕B' of the two polyhedra A and B', at least one of which bounded, as the union of linear translational sweeps wherein said Minkowski sum is expressed as $$A \oplus B' = (A \oplus V_{B'}) \cup (F_A \oplus E_{B'}) \cup (E_A \oplus F_{B'}) \cup (V_A \oplus B');$$

where $V_A$, $E_A$ and $F_A$, respectively, and $V_{B'}$, $E_{B'}$ and $F_{B'}$, respectively, denote the unions of vertices, edges and faces of the polyhedron A and the reflection B' of the polyhedron B; and generating and displaying an image of a geometric object represented by said Minkowski sum, said image simulating the translational free space of the gripper within the workcell.

18. The method recited in claim 17 wherein the polyhedron B is a robotic gripper and the polyhedron A is a workcell containing the gripper and the step of generating and displaying a image produces a visual representation of the translational free space of the gripper within the workcell.

19. A CAD/CAM system including a computer for generating an image of a geometric object in a space which simulates a physical object being modeled on said CAD/CAM system comprising:

data input means for inputting data which defines first and second general polyhedra as a collection of cells which, when combined, form said geometric object;

testing means for testing said data to determine transversality of pairs of said cells;

means responsive to said testing means for determining if two cells are nontransversal, and if so, declaring pairs of cells in the respective boundaries of said two cells cannot be transversal;

means responsive to said testing means for determining if two cells are transversal, and if so, declaring all pairs of cells in their respective boundaries are transversal;

summing means comprising first means for forming Minkowski sums of those pairs of respective cells from each of said first and second general polyhedra which are transversal and second means for forming a union of said Minkowski sums of the cells using Boolean operations to form a Minkowski sum of said first and second general polyhedra; and image generating means for generating and displaying on said display device an image of a geometric object represented by said Minkowski sum of said first and second general polyhedra.

20. The CAD/CAM system recited in claim 19 wherein said means for forming Minkowski sums derives said Minkowski sums from transversal polyhedra in n-space using linear transversal sweeps.

21. The CAD/CAM system recited in claim 19 wherein said means for forming Minkowski sums forms sums by processing cells starting from a lowest dimension and ending with highest dimensional cells, thereby eliminating a large fraction of redundant calculations.

22. The CAD/CAM system recited in claim 19 wherein one of said general polyhedra is full dimensional and wherein said means for forming said Minkowski sums operates on only pairs of cells whose dimensions sum to the dimension of the space.

23. The CAD/CAM system recited in claim 19 wherein both said first and second general polyhedra are full dimensional polyhedra and wherein said means for forming a union of said Minkowski sums translates each polyhedron by vertices of the other polyhedron and sweeps faces of each polyhedron by edges of the other polyhedron.

24. The CAD/CAM system recited in claim 23 wherein only strongly transversal face-edge pairs are used by said means for forming a union of Minkowski sums in translating and sweeping.

25. The CAD/CAM system recited in claim 19 wherein said computer further comprises means for reducing unbounded polyhedra to a union of a finite number of polyhedra, each of which contains no affine line.

26. The CAD/CAM system recited in claim 19 wherein said means for forming Minkowski sums forms the Minkowski sum A⊕B of two polyhedra A and B and the polyhedron A is expanded by the polyhedron B to simulate a process of depositing a layer reflecting the characteristics of the polyhedron B on a substrate having the characteristics of the polyhedron A.

27. The CAD/CAM system recited in claim 26 wherein the simulated deposition process represents a step in semiconductor manufacture and the generation and display of an image by said computer provides a visual representation of the result of said simulated deposition process.

28. The CAD/CAM system recited in claim 19 wherein said means for forming Minkowski sums forms the Minkowski sum A⊕B of two polyhedra A and B and the polyhedron A is eroded by the polyhedron B, said computer further comprising:

first computing means for computing a reflection of the polyhedron B through an origin as $$B' = \{-b: b \in B\}; \text{ and}$$

second computing means for computing the Minkowski sum A⊕B'.

29. The CAD/CAM system recited in claim 28 wherein the process of eroding the polyhedron A by the polyhedron B simulates an etching process in semiconductor manufacture and the generation and display of an image by said computer produces a visual representation of said simulated etching process.

30. The CAD/CAM system recited in claim 19 wherein said means for forming Minkowski sums forms the Minkowski sum $A \oplus B$ of two polyhedra A and B and the polyhedron A is eroded by the polyhedron B, said computer further comprising:

first computing means for computing a reflection of the polyhedron B through an origin as $$B' = \{-b: b \epsilon B\}; \text{ and}$$

second computing means for computing the Minkowski sum $(A \oplus B') \oplus B$.

31. The CAD/CAM system recited in claim 19 wherein said means for forming Minkowski sums forms the Minkowski sum $A \oplus B$ of two polyhedra A and B and the polyhedron A is closed by the polyhedron B, said computer further comprising:

first computing means for computing a reflection of the polyhedron B through an origin as $$B' = \{-b: b \epsilon B\}; \text{ and}$$

second computing means for computing the Minkowski sum of $(A \oplus B') \ominus B$.

32. The CAD/CAM system recited in claim 19 wherein said means for forming Minkowski sums forms the Minkowski sum $A \oplus B$ of two polyhedra A and B and the system determines the translational free space of a polyhedron B in a polyhedron A, said computer further comprising:

first computing means for computing a reflection of B through an origin as $$B' = \{-b: b \epsilon B\}; \text{ and}$$

second computing means for computing the Minkowski sum of $A \ominus B'$.

33. A computer modeling system including a computer for generating images of geometric objects in three-dimensions, said image generating computer receiving as inputs data generated by a computer based simulation system programmed to simulate a deposition process in semiconductor manufacture, said image generating computer generating an image of said deposition process in semiconductor manufacture wherein a polyhedron A is expanded by a polyhedron B where polyhedron A and polyhedron B are defined as collections of cells, said computer modeling system comprising:

data input means for inputting data to said image generating computer from said simulation system which data defines said polyhedrons A and B as a collection of cells which, when combined, form a geometric object;

testing means for testing said data to determine transversality of pairs of said cells;

means responsive to said testing means for determining if two cells are nontransversal, and if so, declaring pairs of cells in the respective boundaries of said two cells cannot be transversal;

means responsive to said testing means for determining if two cells are transversal, and if so, declaring all pairs of cells in their respective boundaries are transversal;

summing means comprising first means for forming Minkowski sums of those respective cells from each of said polyhedra A and B which are transversal and second means for forming a union of said Minkowski sums of the cells using Boolean operations to form the Minkowski sum $A \oplus B$ of the two polyhedra A and B, at least one of which is bounded, as the union of linear translational sweeps wherein said Minkowski sum is expressed as $$A \oplus B = (A \oplus V_B) \cup (F_A \oplus E_B) \cup (E_A \oplus F_B) \cup (V_A \oplus B).$$

where $V_A$, $E_A$ and $F_A$, respectively, and $V_B$, $E_B$ and $F_B$, respectively, denote the unions of vertices, edges and faces of the polyhedrons A and B; and image generating means for generating and displaying on a display device an image of a geometric object represented by said Minkowski sum, said image simulating said deposition process.

34. A computer modeling system including a computer for generating images of geometric objects in three-dimensions, said image generating computer receiving as inputs data generated by a computer based simulation system programmed to simulate an etching process in semiconductor manufacture, said image generating computer generating an image of said etching process in semiconductor manufacture wherein a polyhedron A is eroded by a polyhedron B where polyhedron A and polyhedron B are defined as collections of cells, said computer modeling system comprising:

data input means for inputting data to said image generating computer from said simulation system which data defines said polyhedrons A and B as a collection of cells which, when combined, form a geometric object;

testing means for testing said data to determine transversality of pairs of said cells;

means responsive to said testing means for determining if two cells are nontransversal, and if so, declaring pairs of cells in the respective boundaries of said two cells cannot be transversal;

means responsive to said testing means for determining if two cells are transversal, and if so, declaring all pairs of cells in their respective boundaries are transversal;

computing means for computing the reflection of the polyhedron B through an origin as $$B' = \{-b: b \epsilon B\};$$

summing means comprising first means for forming Minkowski sums of those respective cells from each of said polyhedra A and B' which are transversal and second means for forming a union of said Minkowski sums of the cells using Boolean operations to form the Minkowski sum $A \oplus B'$ of the two polyhedra A and B, at least one of which bounded, as the union of linear translational sweeps wherein said Minkowski sum is expressed as $$A \oplus B' = (A \oplus V_{B'}) \cup (F_A \oplus E_{B'}) \cup (E_A \oplus F_{B'}) \cup (V_A \oplus B'),$$

where $V_A$, $E_A$ and $F_A$, respectively, and $V_{B'}$, $E_{B'}$ and $F_{B'}$, respectively, denote the unisons of vertices, edges and faces of the polyhedron A and the reflection B' of the polyhedron B; and image generating means for generating and displaying on a display device an image of a geometric object represented by said Minkowski sum, said image simulating said etching process.

35. A computer modeling system including a computer for generating images of geometric objects in three-dimensions, said computer simulating translational free space of a robotic gripper within a workcell, said workcell being represented by a polyhedron A and said robotic gripper being represented by a polyhedron B where polyhedron A and polyhedron B are defined as collections of cells, said computer modeling system comprising:

data input means for inputting data which defines said polyhedrons A and B as a collection of cells which, when combined, form a geometric object;

testing means for testing said data to determine transversality of pairs of said cells;

means responsive to said testing means for determining if two cells are nontransversal, and if so, declaring parts of cells in the respective boundaries of said two cells cannot be transversal;

means responsive to said testing means for determining if two cells are transversal, and if so, declaring all parts of cells in their respective boundaries are transversal;

computing means for computing the reflection of B through an origin as $$B' = \{-b: b \in B\};$$

summing means comprising first means for forming Minkowski sums of those respective cells from each of said polyhedra A and B' which are transversal and second means for forming a union of said Minkowski sums of the cells using Boolean operations to form the Minkowski sum $A \oplus B'$ of the two polyhedra A and B', at least one of which bounded, as the union of linear translational sweeps wherein said Minkowski sum is expressed as $$A \oplus B' = (A \oplus V_{B'}) \cup (F_A \oplus E_{B'}) \cup (E_A \oplus F_{B'}) \cup (V_A \oplus B'),$$

where $V_A$, $E_A$ and $F_A$, respectively, and $V_{B'}$, $E_{B'}$ and $F_{B'}$, respectively, denote the unions of vertices, edges and faces of the polyhedron A and the reflection B' of the polyhedron B; and image generating means for generating and displaying on a display device an image of a geometric object represented by said Minkowski sum, said image simulating the translational free space of the gripper within the workcell.

36. The computer recited in claim 35 wherein the polyhedron B is a robotic gripper and the polyhedron A is a workcell containing the gripper and the generation of an image by the computer produces a visual representation of the translational free space of the gripper within the workcell.

37. In a CAD/CAM system including a computer for generating an image of a geometric object in a space which simulates a physical object being modeled on said CAD/CAM system, a method of generating said image comprising the computer performed steps of:

inputting data to said CAD/CAM system which define first and second general polyhedra as a collection of cells which, when combined, form said geometric object, one of said first or second general polyhedra being nontransversal to the other of said first or second polyhedra;

testing said data to determine transversality of pairs of said cells;

determining from the tested data if two cells are nontransversal, and if so, declaring pairs of cells in the respective boundaries of said two cells cannot be transversal;

determining from the tested data if two cells are transversal, and if so, declaring all pairs of cells in their respective boundaries are transversal;

computing surrogate cells of the convex polyhedron;

using said surrogate cells computed for the convex polyhedron to form Minkowski sums of those pairs of respective cells from each of said first and second general polyhedra which are transversal;

forming a union of said Minkowski sums of the cells using Boolean operations to form a Minkowski sum of said first and second general polyhedra; and generating and displaying an image of a geometric object represented by said Minkowski sum of said first and second general polyhedra.

38. The method recited in claim 37 wherein the step of forming said Minkowski sums comprises the step of computing a surrogate of said convex polyhedron with respect to a cell.

39. In a CAD/CAM system including a computer for generating an image of a geometric object in a space which simulates a physical object being modeled on said CAD/CAM system, a method of generating said image comprising the computer performed steps of:

inputting data to said CAD/CAM system which define first and second general polyhedra as a collection of cells which, when combined, form said geometric object;

testing said data to determine transversality of pairs of said cells;

determining from tested data if two cells are nontransversal, and if so, declaring pairs of cells in the respective boundaries of said two cells cannot be transversal;

determining from tested data if two cells are transversal, and if so, declaring all pairs of cells in their respective boundaries are transversal;

forming Minkowski sum of two polyhedra A and B, the polyhedron B being convex, by forming Minkowski sums of those pairs of respective cells from each of said first and second general polyhedra which are transversal by first sweeping the polyhedron B along edges of polyhedron A to form a first intermediate polyhedron and then sweeping the faces of the polyhedron A along surrogate edges of the polyhedron B, thereby raising the faces of polyhedron A by the polyhedron B and forming a second intermediate polyhedron;

forming a polyhedral union of said first and second intermediate polyhedra by forming a union of said Minkowski sums of the cells using Boolean operations to thereby form a Minkowski sum of said first and second general polyhedra; and generating and displaying an image of a geometric object represented by said Minkowski sum of said first and second general polyhedra.

40. A CAD/CAM system including a computer for generating an image of a geometric object in a space which simulates a physical object being modeled on said CAD/CAM system, said computer generating said image on a display device and comprising:

input means for inputting data which define first and second general polyhedra as a collection of cells which, when combined, form said geometric object, one of said first or second general polyhedra being convex, the convex polyhedron being nontransversal to the other of said first or second polyhedron;

testing means for testing the data to determine transversality of pairs of said cells;

means responsive to said testing means for determining if two cells are nontransversal, and if so, declaring pairs of cells in the respective boundaries of said two cells cannot be transversal;

means responsive to said testing means for determining if two cells are transversal, and if so, declaring all pairs of cells in their respective boundaries are transversal;

means for computing surrogate cells of the convex polyhedron;

summing means comprising first means using computed surrogate cells for forming Minkowski sums of those pairs of respective cells from each of said first and second general polyhedra which are transversal and second means for forming a union of said Minkowski sums of the cells using Boolean operations to form a Minkowski sum of said first and second general polyhedra; and image generating means responsive to said summing means for generating and displaying on said display device an image of a geometric object represented by said Minkowski sum of said first and second general polyhedra.

41. The CAD/CAM system recited in claim 40 wherein said means for computing surrogate cells computes a surrogate of said convex polyhedron with respect to a cell.

42. A CAD/CAM system including a computer for generating an image of a geometric object in a space which simulates a physical object being modeled on said CAD/CAM system comprising:

input means for inputting data defining first and second general polyhedra as a collection of cells which, when combined, form said geometric object;

testing means for testing the data to determine transversality of pairs of said cells;

means responsive to said testing means for determining if two cells are nontransversal, and if so, declaring pairs of cells in the respective boundaries of said two cells cannot be transversal;

means responsive to said testing means for determining if two cells are transversal, and if so, declaring all pairs of cells in their respective boundaries are transversal;

summing means for forming the Minkowski sum $A \oplus B$ of two polyhedra A and B, the polyhedron B being convex, said summing means comprising first means for forming Minkowski sums of those pairs of respective cells from each of said first and second general polyhedra which are transversal, said first means including:

first sweep means for sweeping the polyhedron B along edges of the polyhedron A to form a first intermediate polyhedron, second sweep means for sweeping faces of the polyhedron A along a surrogate edge of the polyhedron B, thereby raising the faces of polyhedron B by the polyhedron A and forming a second intermediate polyhedron, and second means for forming the polyhedral union of the first and second intermediate polyhedra by forming a union of said Minkowski sums of the cells using Boolean operations to thereby form a Minkowski sum of said first and second general polyhedra; and image generating means responsive to said summing means for generating and displaying on a display device an image of a geometric object represented by said Minkowski sum of said first and second general polyhedra.

* * * * *